(12) United States Patent
Wang et al.

(10) Patent No.: US 11,333,947 B2
(45) Date of Patent: May 17, 2022

(54) DISPLAY PANEL, DISPLAY APPARATUS, IMAGING METHOD, AND DEPTH DETECTION METHOD

(71) Applicant: BOE TECHNOLOGY GROUP CO., LTD., Beijing (CN)

(72) Inventors: Pengpeng Wang, Beijing (CN); Xiaoliang Ding, Beijing (CN); Yangbing Li, Beijing (CN); Jiabin Wang, Beijing (CN); Ping Zhang, Beijing (CN); Likai Deng, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 557 days.

(21) Appl. No.: 16/475,124

(22) PCT Filed: Dec. 26, 2018

(86) PCT No.: PCT/CN2018/123823
§ 371 (c)(1),
(2) Date: Jun. 30, 2019

(87) PCT Pub. No.: WO2020/010810
PCT Pub. Date: Jan. 16, 2020

(65) Prior Publication Data
US 2021/0364830 A1 Nov. 25, 2021

(30) Foreign Application Priority Data
Jul. 13, 2018 (CN) .......................... 201810772162.5

(51) Int. Cl.
*G02F 1/137* (2006.01)
*H04N 5/225* (2006.01)
(Continued)

(52) U.S. Cl.
CPC ........ *G02F 1/137* (2013.01); *G02F 1/134309* (2013.01); *G02F 1/155* (2013.01);
(Continued)

(58) Field of Classification Search
CPC .... G02F 1/137; G02F 1/134309; G02F 1/155; G02F 1/167; G02F 1/1676;
(Continued)

(56) References Cited

U.S. PATENT DOCUMENTS

| | | | |
|---|---|---|---|
| 2008/0106629 A1* | 5/2008 | Kurtz | ..................... H04N 7/144 348/E5.022 |
| 2011/0019056 A1* | 1/2011 | Hirsch | ................. H04N 5/2226 348/333.01 |

(Continued)

*Primary Examiner* — Sinh Tran
*Assistant Examiner* — Zhenzhen Wu
(74) *Attorney, Agent, or Firm* — Syncoda LLC; Feng Ma

(57) ABSTRACT

A display panel capable of capturing an image of an object over a light-entering surface thereof includes a displaying array, a light valve array, and an imaging array, which are sequentially below the light-entering surface. The light valve array includes a plurality of light valve portions and can form a plurality of first mask patterns, and at least two first mask patterns are configured to be different. The displaying array includes a plurality of displaying pixels and can form a second mask pattern. The imaging array includes a plurality of imaging pixels and can generate an intermediate image upon receiving lights from the object and transmitting through the second mask pattern in the displaying array and at least one of the plurality of first mask patterns in the light valve array. The image of the object can then be deduced from the intermediate image.

20 Claims, 14 Drawing Sheets

(51) Int. Cl.
  *G02F 1/1676* (2019.01)
  *G02F 1/1343* (2006.01)
  *G02F 1/155* (2006.01)
  *G02F 1/167* (2019.01)
(52) U.S. Cl.
  CPC ............ *G02F 1/167* (2013.01); *G02F 1/1676* (2019.01); *H04N 5/2257* (2013.01)
(58) Field of Classification Search
  CPC ............ G02F 1/13312; G02F 1/13306; H04N 5/2257; H01L 27/3211; H01L 27/3234; G06F 3/041
  See application file for complete search history.

(56) References Cited

U.S. PATENT DOCUMENTS

| | | | |
|---|---|---|---|
| 2012/0026160 A1* | 2/2012 | Suh ...................... | H04N 13/315 345/419 |
| 2014/0184754 A1* | 7/2014 | Suh ...................... | H04N 13/232 348/50 |

* cited by examiner

DISPLAY PANEL, DISPLAY APPARATUS, IMAGING METHOD, AND DEPTH DETECTION METHOD

CROSS-REFERENCE TO RELATED APPLICATION

The present application claims priority to Chinese Patent Application No. 201810772162.5 filed on Jul. 13, 2018, the disclosure of which is hereby incorporated by reference in its entirety.

TECHNICAL FIELD

The present disclosure relates generally to a display technology, and more specifically to a display panel, a display apparatus, an imaging method, and a depth detection method.

BACKGROUND

With the development of science and technology, the Internet of Things (IoTs) age is coming. In an Internet of Things system, the data needed for realizing Internet of Things needs to be obtained with various sensors. Therefore, low lost and highly integrated sensors are very important in the Internet of Things system.

Because of the wide spread of mobile devices (for example mobile phones), the modern society has entered an age in which everyone reads on a display screen. The display screen is a necessary and important component in mobile devices. According to Occam's Razor theory, display screens and various sensors are integrated and serve as information input terminals and information output terminals at the same time, it might be the ultimate state of future electronic products. Therefore, the integration of various sensors and display screens will become an emphasis in future research.

SUMMARY

In a first aspect, the present disclosure provides a display panel, which is capable of capturing an image of an object over a light-entering surface of the display panel.

The display panel includes a displaying array, a light valve array, and an imaging array, which are sequentially below the light-entering surface. The light valve array comprises a plurality of light valve portions and is configured to form a plurality of first mask patterns, configured such that at least two of the plurality of first mask patterns are different. The displaying array comprises a plurality of displaying pixels and is configured to form a second mask pattern. The imaging array comprises a plurality of imaging pixels and is configured to generate an intermediate image upon receiving lights from the object and transmitting through the second mask pattern in the displaying array and at least one of the plurality of first mask patterns in the light valve array. The image of the object can be deduced from the intermediate image.

According to some embodiments of the display panel, the light valve array is a liquid crystal light valve array, and each of the plurality of light valve portions comprises a liquid crystal layer and a control electrode. The liquid crystal layer comprises liquid crystal molecules, and the control electrode is configured to control deflection of the liquid crystal molecules in the liquid crystal layer to thereby adjust a rate of light transmittance of the each of the plurality of light valve portions.

Herein, optionally, the control electrode can comprise a first control sub-electrode and a second control sub-electrode, which are insulated from each other.

According to some embodiments of the display panel, each of the plurality of light valve portions can be an inactive liquid crystal light valve portion. The display panel further comprises a first signal line, and a second signal line. The first signal line is electrically connected to the first control sub-electrode, and is configured to transmit a data voltage signal to the first control sub-electrode. The second signal line is electrically connected to the second control sub-electrode, and is configured to transmit a scan voltage signal to the second control sub-electrode.

According to some other embodiments of the display panel, each of the plurality of light valve portions is an active liquid crystal light valve portion. The display panel further comprises a first signal line, a second signal line, and a first switch component. A first terminal of the first switch component is electrically connected to the first signal line to receive a data voltage signal therefrom; a second terminal of the switch component is electrically connected to the first control sub-electrode; and a control terminal of the first switch component is electrically connected to a second signal line to receive a scan voltage signal therefrom.

Herein, further optionally, the display panel further comprises a third signal line, which is electrically connected to the second control sub-electrode, and is configured to transmit a common voltage signal to the second control sub-electrode.

According to some other embodiments of the display panel, the light valve array is an electronic ink light valve array. Each of the plurality of light valve portions comprises an electronic ink layer and a control electrode. The electronic ink layer has a plurality of charged light-blocking particles. The control electrode is configured to control distribution of the plurality of charged light-blocking particles in the electronic ink layer to thereby adjust a rate of light transmittance of the each of the plurality of light valve portions.

Herein, optionally, the control electrode can comprise a first control sub-electrode, a second control sub-electrode, a third control sub-electrode, and a fourth control sub-electrode. The first control sub-electrode and the second control sub-electrode are respectively over two opposing surfaces of the electronic ink layer, and each of the two opposing surfaces is substantially in parallel to the electronic ink layer. The third control sub-electrode and the fourth control sub-electrode are respectively over two opposing side surfaces of the electronic ink layer, and each of the two opposing side surfaces is substantially perpendicular to the electronic ink layer.

According to yet some other embodiments of the display panel, the light valve array is an electrochromic light valve array. Each of the plurality of light valve portions comprises an electrochromic layer and a control electrode. The control electrode is configured to be applied with a voltage to thereby adjust a rate of light transmittance of the each of the plurality of light valve portions.

Herein, optionally, the control electrode can comprise a first control sub-electrode and a second control sub-electrode. The first control sub-electrode and the second control sub-electrode are respectively over two opposing surfaces of the electrochromic layer, wherein each of the two opposing surfaces is substantially in parallel to the electrochromic layer.

According to some embodiments of the display panel, each of the plurality of displaying pixels comprises a plurality of sub-pixels, and each sub-pixel is configured to emit a different color and together configured to obtain a white color. Each of the plurality of sub-pixels comprises a light-emitting component, selected from an organic light-emitting diode or a micro light-emitting diode pixel.

According to some embodiments of the display panel, the imaging array comprises an active pixel imaging array, and each of the plurality of imaging pixels comprises a photosensitive component. The photosensitive component comprises a photodiode or a photoresistor.

Herein, according to some embodiments, each of the plurality of imaging pixels comprises a photodiode and a first capacitor. The photodiode is configured to convert an optical signal into an electric signal, and the first capacitor is configured to store the electric signal. A first terminal of the photodiode is electrically connected to a first terminal of the first capacitor; and a second terminal of the photodiode and a second terminal of the first capacitor are both electrically connected to a first power source terminal.

Furthermore, the display panel can further include a signal reading circuit, a second switch component, a fourth signal line, and a fifth signal line. A first terminal of the second switch component is electrically connected to the fourth signal line; a second terminal of the second switch component is electrically connected to the each of the plurality of imaging pixels; a control terminal of the second switch component is electrically connected to the fifth signal line. The fourth signal line is electrically connected to the signal reading circuit; and the signal reading circuit is configured to read the electrical signal of the each of the plurality of imaging pixels.

The display panel can further include a first substrate and a second substrate, which are opposing to each other. As such, the light valve array and the imaging array can be between the first substrate and the second substrate, and the imaging array can be closer to the first substrate in relation to the light valve array.

According to some embodiments of the display panel, each light valve portion corresponds to at least one imaging pixel.

For example, in certain embodiments, each light valve portion corresponds to two imaging pixels, and an orthographic projection of the each light valve portion on the light-entering surface completely overlaps with the orthographic projections of the at least imaging pixels on the light-entering surface.

In a second aspect, the present disclosure further provides a display apparatus.

The display apparatus comprises a display panel according to any one the embodiments of the display panel as described above.

In a third aspect, the present disclosure also provides a method for capturing an image of an object using a display panel. Herein the display panel can be based on any one the embodiments of the display panel as described above.

The method comprises the following steps:

controlling a displaying array and a light valve array to respectively form a second mask pattern and a first mask pattern;

generating an intermediate image based on lights from the object and transmitting through the second mask pattern and the first mask patterns; and deducing the image of the object from the intermediate image based on a first decoding function respectively corresponding to the first mask pattern and a second decoding function corresponding to the second mask pattern.

In a fourth aspect, the present disclosure also provides a method for determining a depth of a display panel. Herein the display panel can be based on any one the embodiments of the display panel as described above.

The method can include the following steps:

capturing a plurality of images of an object in front of a light-entering surface of the display panel corresponding to a plurality of first mask patterns and the second mask pattern formed on the display panel, wherein the plurality of first mask patterns are different from one another; and determining the depth of the display panel based on the plurality of images.

According to some embodiments of the method, the step of capturing a plurality of images of the object corresponding to a plurality of first mask patterns and the second mask pattern formed on the display panel comprise the following sub-steps:

controlling a displaying array and a light valve array to respectively form a second mask pattern and a plurality of first mask patterns;

generating a plurality of intermediate images based on lights from the object and transmitting through the second mask pattern and each of the plurality of first mask patterns, wherein the plurality of intermediate images correspond to the plurality of first mask patterns in a one-to-one relationship;

determining a plurality of decoding function groups based on a plurality of first decoding functions respectively corresponding to the plurality of first mask patterns and a second decoding function corresponding to the second mask pattern, wherein each of the plurality of decoding function groups comprises each of the plurality of first decoding functions and the second decoding function; and deducing the plurality of images of the object from the plurality of intermediate images respectively based on the plurality of decoding function groups.

Optionally in the method, in the sub-step of controlling a displaying array and a light valve array to respectively form a second mask pattern and a plurality of first mask patterns, the plurality of first mask patterns can be formed by means of a time-share multiplexing approach, or alternatively can be formed by means of a space-share multiplexing approach.

According to some embodiments of the method, in the step of determining the depth of the display panel based on the plurality of images, the depth can be determined based on clarity of the plurality of captured images.

Further optionally, a distance corresponding to one of the plurality of captured images having a greatest clarity can be determined as the depth.

BRIEF DESCRIPTION OF DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of the embodiments disclosed herein, the technical solutions of the embodiments of the invention will be described in a clear and fully understandable way.

It is noted that the described embodiments are merely a portion but not all of the embodiments of the invention. Based on the described embodiments of the invention, those ordinarily skilled in the art can obtain other embodiment(s), which come(s) within the scope sought for protection by the disclosure.

Cameras with lenses typically have optical components such as sophisticated and precise lenses, and thus it is difficult to reduce the sizes of this type of cameras. Therefore, the lensless imaging method and technology has been the emphasis and difficulty of research in the miniaturization of cameras. With the development of the technology, a large number of lensless imaging methods have emerged.

One of these solutions mainly involves adding an imaging mask over the surface of an imaging sensor to thereby form an intermediate image of an object in front of the imaging device having the imaging mask. Then the intermediate image is processed through a backend processor to convert or reduce the intermediate image into the image of the object.

In addition, with the development of three-dimensional (3D) technology, in technological fields such as 3D display, computer vision and satellite sensing, there is a need to obtain the depth information of a scene to represent the three-dimensional information of the object in the scene.

Figure 1:
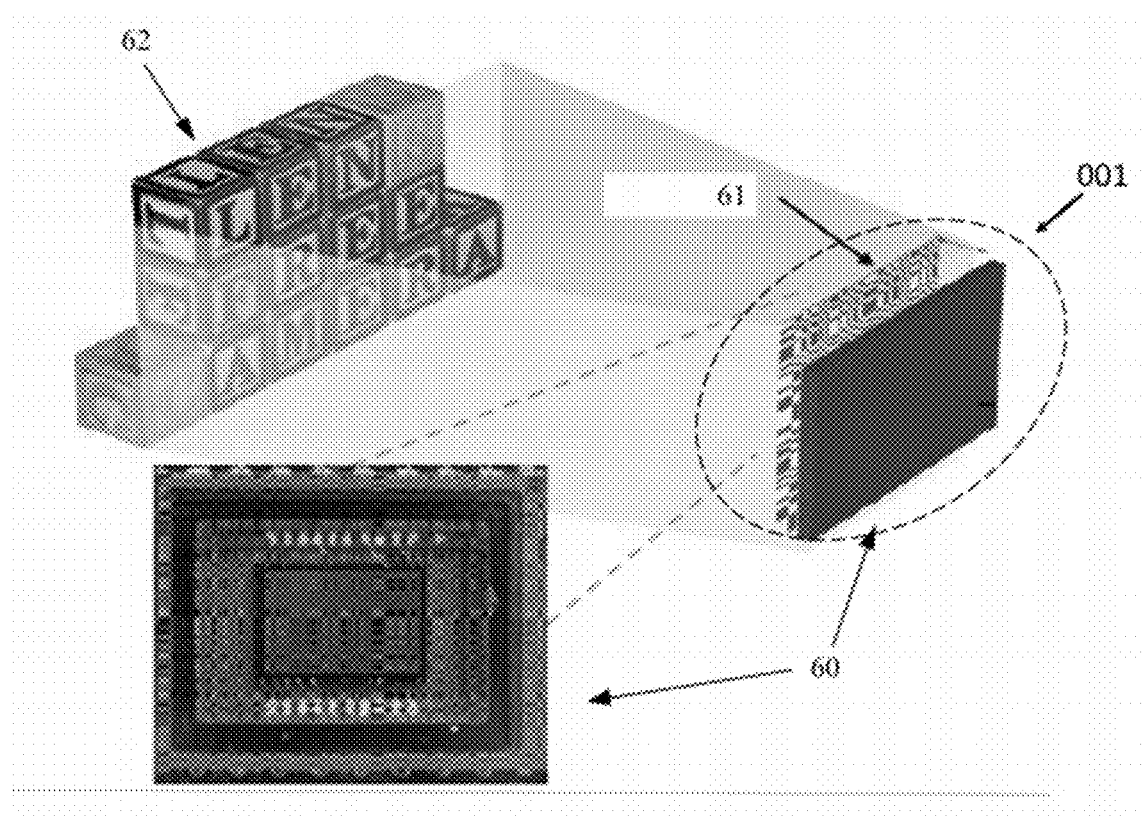
FIG. 1 is a schematic diagram of a lensless imaging method based on an existing technology.

FIG. 1 is a schematic diagram illustrating a lensless imaging method based on an existing technology described above. As shown in FIG. 1, in an imaging device 001 employing this above imaging method, the image sensor 60 is a silicon-based image sensor, and an optical mask 61 is arranged in front of the image sensor 60 in the imaging device 001. The optical mask 61 is generally fixed in its position and in its pattern. When a scene 62 (e.g. an object) is in front of the imaging device 001, an intermediate image can be first generated over the image sensor 60 through the optical mask 61, then a backend processor (not shown in the figure) can be used to decode (i.e. convert) the intermediate image into a captured image of the scene 62.

However, this above imaging method has the following issues. First, the silicon-based components are simply not integrated onto a display panel. Second, the optical mask 61 typically has a fixed pattern, and during the process described above, the pattern of the optical mask 61 cannot be changed, causing that the applicable scenes are limited.

In order to address the above issues, the present disclosure provides a display panel, a display apparatus, an imaging method and a depth detection method. In the display panel disclosed herein, a first mask pattern can be formed by means of a light valve array to thereby realize a lensless imaging, which can thus result in a reduced thickness of the imaging portion. In addition, the light valve array can be controlled by programs to thus be able to form a variety of different first mask patterns, such that the mask patterns can be altered, which can satisfy the requirements of various practical applications.

In a first aspect, the present disclosure provides a display panel. The display panel is capable of capturing an image of an object over a light-entering surface of the display panel.

The display panel includes a displaying array, a light valve array, and an imaging array, which are sequentially below the light-entering surface. The light valve array includes a plurality of light valve portions and is configured to form a plurality of first mask patterns, and at least two of the plurality of first mask patterns are configured to be different.

The displaying array comprises a plurality of displaying pixels and is configured to form a second mask pattern. The imaging array comprises a plurality of imaging pixels and is configured to generate an intermediate image upon receiving lights from the object and transmitting through the second mask pattern in the displaying array and at least one of the plurality of first mask patterns in the light valve array. The image of the object can be deduced from the intermediate image.

Figure 2:
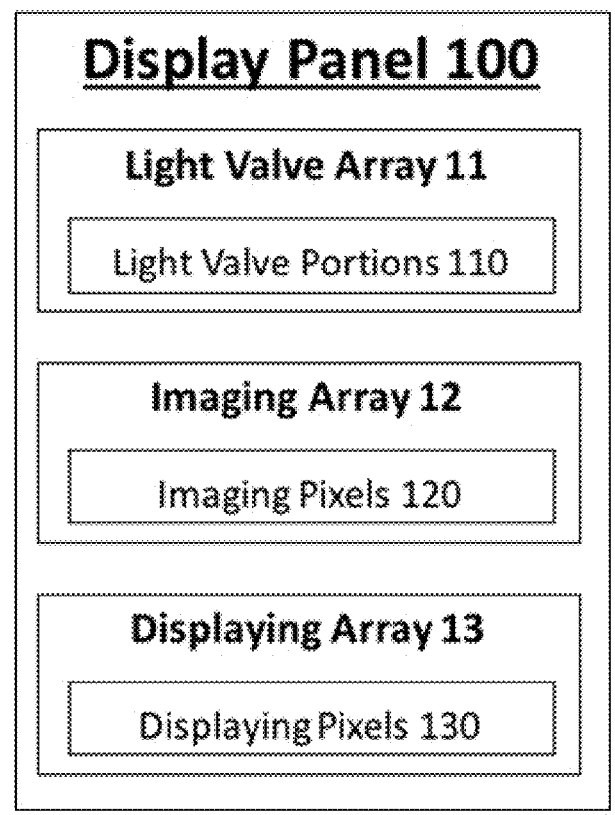
FIG. 2 is a schematic view of a display panel provided by an embodiment of the present disclosure.

FIG. 2 is a block diagram of a display panel provided by an embodiment of the present disclosure. As shown in FIG. 2, the embodiment of the display panel 100 comprises a light valve array 11, an imaging array 12 and a displaying array 13.

The light valve array 11 comprises a plurality of light valve portions 110, and the light valve array 11 is configured to form a plurality of first mask patterns, and at least two of the plurality of first mask patterns are configured to be different. The displaying array 13 comprises a plurality of displaying pixels 130, and the displaying array 13 is configured to form a second mask pattern. The imaging array 12 comprises a plurality of imaging pixels 120, and the imaging array 12 is configured to receive lights transmitted through the displaying array 13 and the light valve array 11 and to generate an intermediate image based on the received lights.

Figure 3:
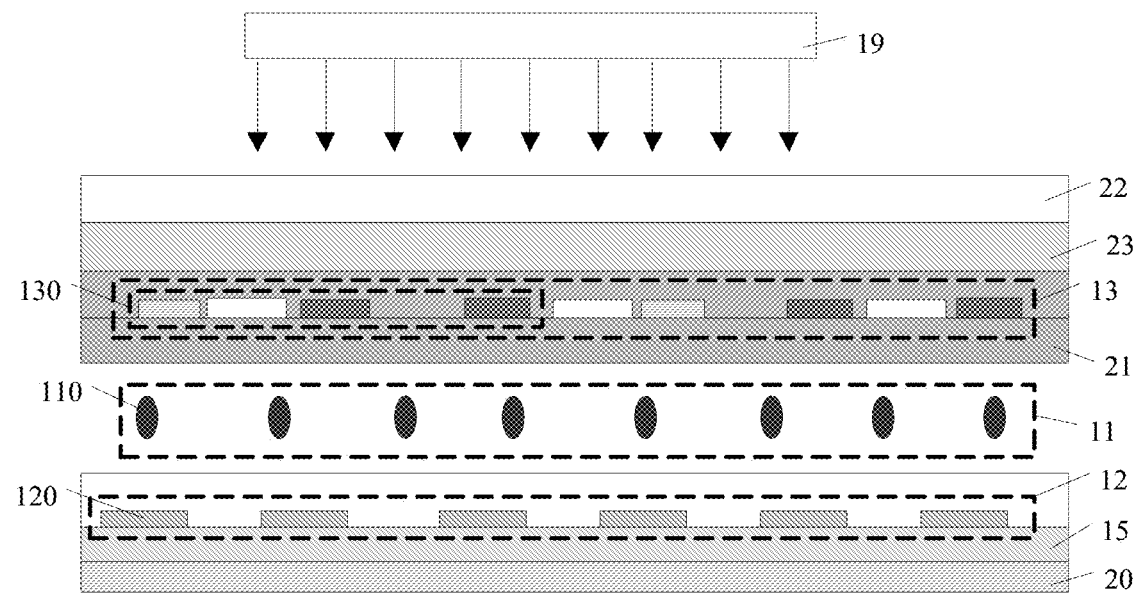
FIG. 3 is a cross-sectional view of a display panel provided by an embodiment of the present disclosure.

FIG. 3 is a cross-sectional view of a display panel provided by an embodiment of the present disclosure. As shown in FIG. 3, the display panel 100 further comprises a first substrate 20 and a second substrate 21. The second substrate 21 and the first substrate 20 are configured to opposingly face each other. The light valve array 11 and the imaging array 12 are both arranged between the first substrate 20 and the second substrate 21. Compared with the light valve array 11, the imaging array 12 is arranged to be closer to the first substrate 20. In other words, the light valve array 11 is between the second substrate 21 and the imaging array 12, as illustrated in FIG. 3.

According to some embodiments of the display panel, the imaging array 12 is integrated into, or formed directly onto, the first substrate 20. Optionally, the imaging array 12 can be an active pixel imaging array, and each of the plurality of imaging pixels 120 comprises at least one photo-sensitive component. Herein, each of the at least one photo-sensitive component can comprise a photodiode, a photoresistor, or other suitable component. Further optionally, the photodiode can comprise a PN junction photodiode, a PIN junction photodiode, an avalanche photodiode, or a Schottky photodiode, and so on.

In addition, each of the plurality of imaging pixels 120 can further comprise at least one of a switch transistor, a resetting transistor, an amplifier transistor, or a storage capacitor, depending on practical needs.

Optionally, the imaging array 12 can comprise a charge coupled device (CCD) image sensor, a complementary metal oxide semiconductor (CMOS) image sensor, and so on.

Optionally, each of the first substrate 20 and the second substrate 21 can be a glass substrate, a quartz substrate, or a plastic substrate, and so on. The second substrate can be a transparent substrate.

Optionally, the second mask pattern can be determined by the displaying array 13, and remains fixed or unchanged during the imaging process.

With further reference in FIG. 3, the displaying array 13 is arranged over a side of the light valve array 11 that is far away from the imaging array 12. In other words, in the display panel, the light valve array 11 is arranged to be between the displaying array 13 and the imaging array 12.

More specifically, the displaying array 13 can be onto the second substrate 21, and can be arranged over a side of the second substrate 21 that is far away from the first substrate 20. The light valve array 11 is arranged over a side of the second substrate 21 that is close to the first substrate 20. That is, the displaying array 13 and the light valve array 11 are respectively over two opposing sides of the second substrate 21, as shown in FIG. 3.

Optionally, the displaying array 13 can be an organic light-emitting diode displaying array. Each of the plurality of displaying pixels 130 can comprise a plurality of displaying sub-pixels, each configured to emit a different color.

According to some embodiments of the present disclosure, each of the plurality of displaying pixels 130 comprises a first displaying sub-pixel, a second displaying sub-pixel and a third displaying sub-pixel, configured to respectively emit a light of a first color, a light of a second color, and a light of a third color. The first displaying sub-pixel comprises a first-color pixel electrode and a first-color light-emitting layer over the first-color pixel electrode. The second displaying sub-pixel comprise a second-color pixel electrode and a second-color light-emitting layer over the second-color pixel electrode. The third displaying sub-pixel comprises a third-color pixel electrode and a third-color light-emitting layer over the third-color pixel electrode.

Optionally, the first-color light-emitting layer is configured to emit a red light (R), the second-color light-emitting layer is configured to emit a blue light (B), and the third-color light-emitting layer is configured to emit a green light (G). That is, these above embodiments of the display panel 100 substantially adopt a RGB color display scheme.

According to some other embodiments of the display panel, each of the plurality of displaying pixels 130 can comprise four displaying sub-pixels, and these four displaying sub-pixels are a red-color displaying sub-pixel (R), a blue-color displaying sub-pixel (B), a green-color displaying sub-pixel (G), and a white-color displaying sub-pixel (W), respectively. That is, these above embodiments of the display panel 100 substantially adopt a RGBW color display technology which, compared with the RGB display scheme, can improve the light transmittance of the display apparatus containing the display panel 100, reduce the backlight brightness level, and reduce power consumption.

It is noted that besides the RGB color display scheme and the RGBW color display scheme, other color display schemes are also possible, and there are no limitations herein.

According to some embodiments of the display panel 100, a region of the displaying array 13 that positionally correspond to each displaying sub-pixel in each of the plurality of displaying pixels 130 in the displaying array 13 is configured to be an opaque or non-transparent region, whereas gap regions of the displaying array 13 between any two neighboring displaying sub-pixels are configure to be transparent or non-transparent. These above transparent regions (e.g. the transparent gap regions) and the non-transparent regions (e.g. the regions positionally corresponding to displaying sub-pixels or the non-transparent gap regions) together form the second mask pattern in the displaying array 13.

In the embodiments of the display panel shown in FIG. 3, in the displaying array 13, the regions labeled with white squares between displaying sub-pixels represent transparent regions, whereas the regions not labeled with white squares between displaying sub-pixels represent non-transparent regions.

It should be noted that the gap regions between any two displaying sub-pixels in the displaying pixel 130 can, according to some embodiments, be all transparent, and there are no limitations herein.

As further shown in FIG. 3, the display panel 100 further comprises a third substrate 22. The third substrate 22 is arranged over a side of the second substrate 21 that is far away from the first substrate 20, which can be further bonded to the second substrate 21 via a sealant 23 and can serve functions such as protection.

In certain embodiments, the third substrate 22 is further provided with a touch control electrode structure (e.g. a self-capacitance touch control electrode structure, not shown in the drawings), and as a result, the display panel 100 also has a touch control function.

Herein, optionally, the sealant 23 can comprise an organic material, an inorganic material, or a combination of organic and inorganic materials. Furthermore, the organic material may comprise epoxy resin, polyurethane, organic silicon dioxide, acrylate, polysiloxane, polyamide, polyester or any combination of the aforementioned material, and the inorganic material may comprise a material such as sodium silicate.

According to some embodiments of the display panel 100, the light valve array 11 comprises a liquid crystal light valve array, and each of the plurality of liquid crystal light valve portions 110 is substantially a liquid crystal light valve portion. The liquid crystal light valve array as such can be driven through an active approach or an inactive approach, based on different embodiments of the disclosure.

Figure 4:
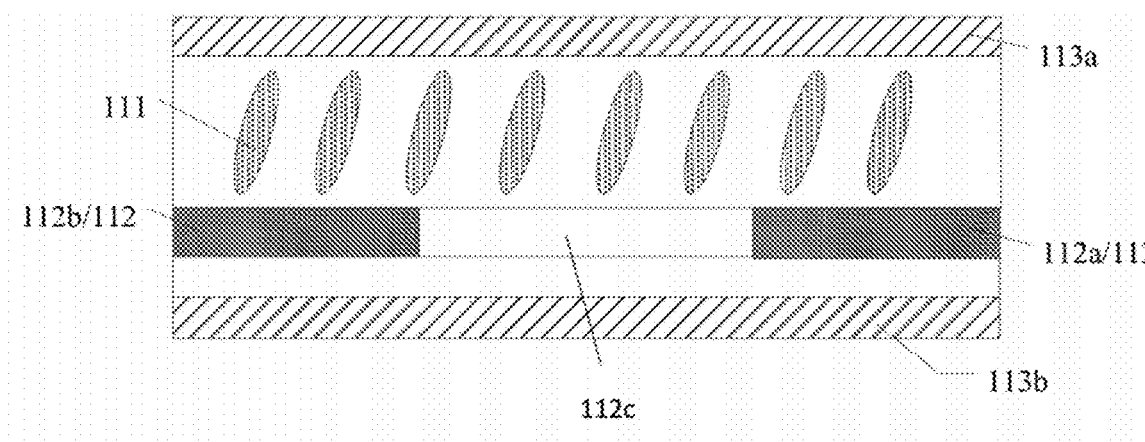
FIG. 4 is a schematic view of a liquid crystal light valve portion of a liquid crystal light valve array provided by an embodiment of the present disclosure.

FIG. 4 is a schematic view of a liquid crystal light valve portion of the liquid crystal light valve array provided by some embodiments of the present disclosure. As shown in FIG. 4, the liquid crystal light valve portion comprises a liquid crystal layer 111 and a control electrode 112. The liquid crystal layer 111 comprises liquid crystal molecules; and the control electrode 112 is configured to control deflection of the liquid crystal molecules to thereby adjust the light transmittance of the liquid crystal light valve portion.

Furthermore, the control electrode 112 comprises a first control sub-electrode 112a and a second control sub-electrode 112b, and the first control sub-electrode 112a and the second control sub-electrode 112b are insulated from each other.

In the structure shown in FIG. 4, the first control sub-electrode 112a and the second control sub-electrode 112b are arranged over a same side of the liquid crystal layer 111. Optionally, the first control sub-electrode 112a and the second control sub-electrode 112b can both comprise a strip electrodes. Alternatively, one of the first control sub-electrode 112a and the second control sub-electrode 112b is a strip electrode, and the other of the first control sub-electrode 112a and the second control sub-electrode 112b is a plate electrode.

In addition, an insulating layer 112c can be arranged between the first control sub-electrode 112a and the second control sub-electrode 112b to thereby realize insulation therebetween, as illustrated in FIG. 4.

Herein, according to some embodiments illustrated in FIG. 4, the first control sub-electrode 112a and the second control sub-electrode 112b are arranged both over the first substrate 20 (or more specifically over a surface of the liquid crystal layer 111) and at a substantially same layer.

Alternatively, according to some other embodiments (not shown in the drawings), the first control sub-electrode 112a and the second control sub-electrode 112b are both over the first substrate 20 (or more specifically over a surface of the liquid crystal layer 111), yet at a different layer.

Further alternatively, according to yet some other embodiments (not shown in the drawings), the first control sub-electrode 112a and the second control sub-electrode 112b are arranged over a different side of the liquid crystal layer 111. In one such example (not shown in the drawings), the first control sub-electrode 112a is arranged onto the first substrate 20 and is located over a side of the first substrate 20 that is close to the second substrate 21; whereas the second control sub-electrode 112b is arranged onto the second substrate 21 and is located over a side of the second substrate 21 that is close to the first substrate 20.

According to some embodiments of the display panel, the control electrode 112 (e.g. the first control sub-electrode 112a and the second control sub-electrode 112b) is a transparent electrode, and as a result, the influence of the control electrode 112 on the plurality of first mask patterns that are formed on the light valve array 11 can be prevented.

It should be noted that in the present disclosure, there are no limitations to the shape, number and location of the control electrode 112 in the liquid crystal light valve portion. In one illustrating example, the first control sub-electrode 112a and the second control sub-electrode 112b in one control electrode 112 can both be arranged onto the second substrate 21, and the first control sub-electrode 112a and the second control sub-electrode 112b can also both be plate electrodes.

In addition, when the control electrode 112 (e.g. the first control sub-electrode 112a and/or the second control sub-electrode 112b) is a plate electrode or a stripe electrode, each control electrode 112 can positionally correspond to a plurality of liquid crystal light valve portions. As such, in a direction perpendicular to the first substrate 20, the portion of the control electrode that is overlaid with the liquid crystal light valve portion substantially represents the control electrode of this liquid crystal light valve portion. When the control electrode 112 (e.g. the first control sub-electrode 112a and/or the second control sub-electrode) is a plate electrode, each liquid crystal light valve portion can comprise an independent control electrode 112.

With further reference to FIG. 4, the liquid crystal light valve portion further comprises a first polarizer 113a and a second polarizer 113b. In the direction perpendicular to the first substrate 20, the first polarizer 113a and the second polarizer 113b are respectively located over two opposing surfaces (i.e. a top surface and a bottom surface) of the liquid crystal layer 111. The polarization directions of the first polarizer 113a and the second polarizer 113b are configured to be substantially perpendicular to each other.

Herein, the lights transmitting through the light valve array 11 become linearly polarized lights after passing through the first polarizer 113a, and the control electrode 112 controls the deflection angle of the liquid crystal molecules in the liquid crystal layer 111, and as a result, the polarization direction of the linearly polarized lights can be changed. Therefore, the light transmittance of the linearly polarized lights passing through the second polarizer 113b can be controlled.

For example, in the case where no voltage is applied to the control electrode 112, lights transmitting through the light valve array 11 become linearly polarized lights after passing through the first polarizer 113a, and the polarization direction of the linearly polarized lights does not change after passing through the liquid crystal layer 111, and as such, the linearly polarized lights cannot pass through the second polarizer 113b. That is, the liquid crystal valve portion is in a light-blocking state.

In the case where a voltage is applied to the control electrode 112 and the liquid crystal molecules in the liquid crystal layer 111 is deflected, for example, by 90 degrees, the lights transmitting through the light valve array 11 become linearly polarized lights after passing through the first polarizer 113a, and the polarization direction of the linearly polarized lights further deflects 90 degrees after passing through the liquid crystal layer 111, and as such, the linearly polarized lights can all pass through the second polarizer 113b. That is, the liquid crystal light valve portion is in a light-transmitting state, and the light transmittance of the liquid crystal light valve portion is the largest.

Furthermore, by controlling the voltage applied to the control electrode 112, the degree of deflection of the liquid crystal molecules can be controlled. Thereby, the liquid crystal light valve portion can have different rates of light transmittance when in the light-transmitting state.

It should be noted that in the present disclosure, there are no limitations to the relationship between the polarization directions of the first polarizer 113a and the second polarizer 113b.

For example, the polarization directions of the first polarizer 113a and the second polarizer 113b can be configured as substantially parallel to each other according to some embodiments of the display panel, or configured to have any angle therebetween, as long as the liquid crystal light valve portion can have different rates of light transmittance to thereby realize a corresponding first mask pattern.

In the following, certain embodiments of the display panel disclosed herein will be described in detail with reference to FIG. 5A, FIG. 5B, FIG. 6A and FIG. 6B, where the light valve array comprises a liquid crystal light valve array.

Figure 5A:
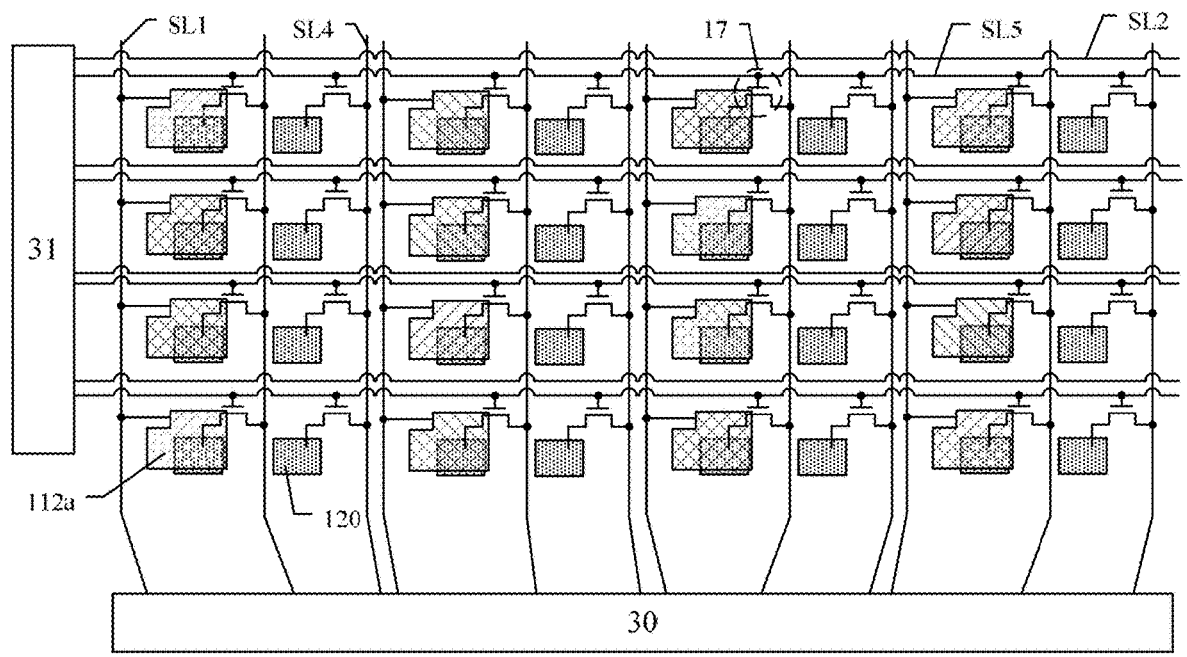
FIG. 5A is a schematic view of a display panel provided by an embodiment of the present disclosure.
Figure 5B:
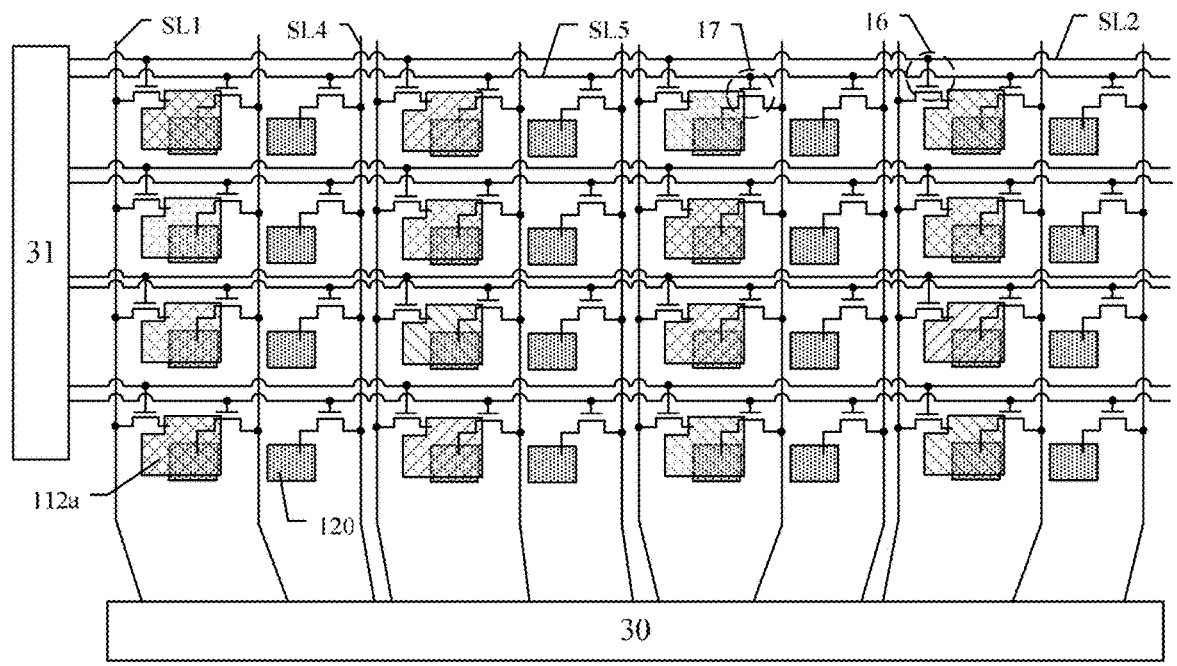
FIG. 5B is a schematic view of another display panel provided by an embodiment of the present disclosure.
Figure 6A:
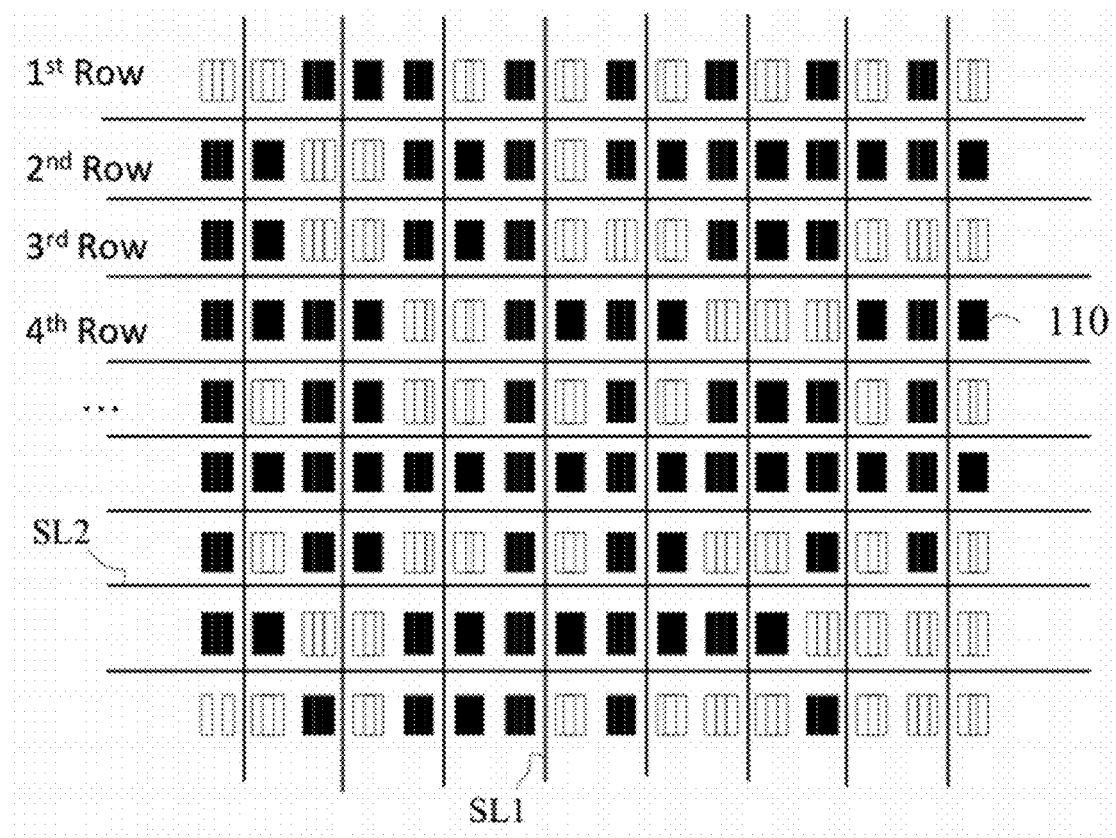
FIG. 6A is a schematic view of a first mask pattern of a liquid crystal light valve array provided by an embodiment of the present disclosure.
Figure 6B:
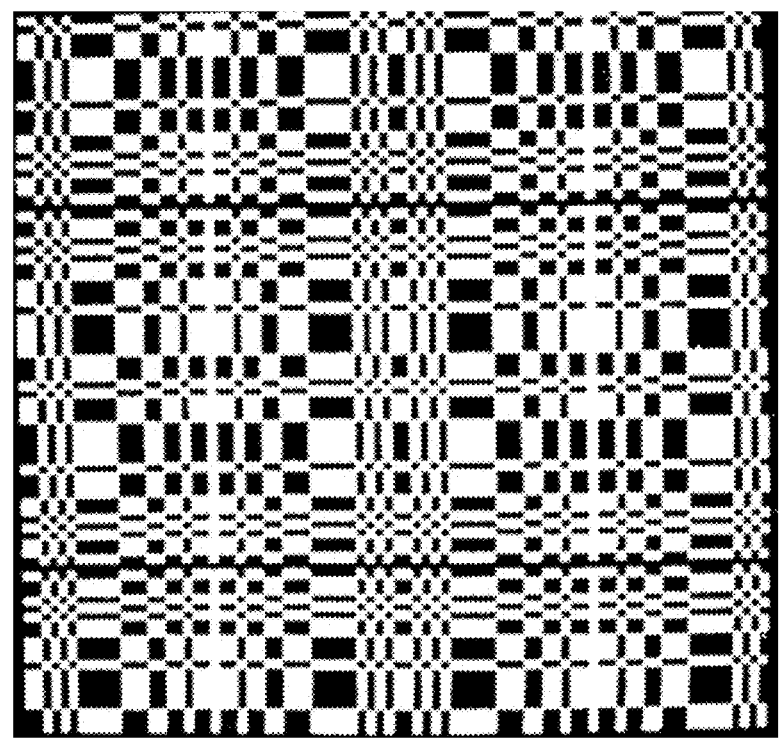
FIG. 6B is a schematic view of another first mark pattern of a liquid crystal light valve array provided by an embodiment of the present disclosure.

FIG. 5A is a schematic plan view of a display panel provided by one embodiment of the present disclosure, and FIG. 5B is a schematic plan view of a display panel provided by another embodiment of the present disclosure. FIG. 6A is a schematic view of a first mask pattern formed by a liquid crystal light valve array provided by one embodiment of the present disclosure, and FIG. 6B is a schematic view of a first mask pattern formed by a liquid crystal light valve array provided by another embodiment of the present disclosure.

As shown in FIG. 5A and FIG. 5B, a plurality of liquid crystal light valve portions are arranged over the first substrate 20. The first control sub-electrode 112a of each liquid crystal light valve portion comprises a plate electrode.

The plurality of first control sub-electrodes 112a can be arranged in an array over the first substrate 20, as illustrated in FIG. 5A and FIG. 5B. The second control sub-electrode 112b (not shown in figures) can be a stripe electrode, and each second control sub-electrode 112b can correspond to the liquid crystal light valve portion of the same row.

With further reference to FIG. 5A, FIG. 5B and FIG. 3, along a direction perpendicular to the first substrate 20, the imaging array 12 can be arranged under the liquid crystal light valve array 11.

In the display panel shown in FIG. 5A, when a voltage is applied to the control electrode to thereby form an electric field, the electric filed can control the deflection degree of the liquid crystal molecules in the liquid crystal layer. Some liquid crystal light valve portions of the liquid crystal light valve array can be in a light-blocking state, whereas some other liquid crystal light valve portions may be in a light-transmitting state.

It should be noted herein that according to the different rates of light transmittance of the liquid crystal light valve portions, the light-transmitting state can comprise a plurality of light-transmitting sub-states. For example, when the light transmittance of the liquid crystal light valve portion is 100%, the liquid crystal light valve portion is in a first light-transmitting sub-state; when the light transmittance of the liquid crystal light valve portion is 70%, the liquid crystal light valve portion may be in a second light-transmitting sub-state; when the light transmittance of the liquid crystal light valve portion is 50%, the liquid crystal light valve portion may be in a third light-transmitting sub-state, and so on. As a result, the first mask pattern be become more sophisticated and can vary.

According to some embodiments of the display panel shown in FIG. 5A, the liquid crystal light valve portion is an inactive liquid crystal light valve portion. Herein an inactive liquid crystal light valve portion has advantages, such as simpler structure and manufacturing process, yet the control time sequence of the inactive liquid crystal light valve portion needs to be synchronized with the time sequence control of the imaging array 12.

As further shown in FIG. 5A, the display panel 100 further comprises a first signal line SL1 and a second signal line SL2. The first signal line SL1 is electrically connected to the first control sub-electrode 112a, and it is configured to transmit a data voltage signal (i.e. a first voltage control signal) to the first control sub-electrode 112a. The second signal line SL2 is electrically connected to the second control sub-electrode 112b (not shown in the figure), and it is configured to transmit a scan voltage signal (i.e. a second voltage control signal) to the second control sub-electrode 112b.

As such, in the inactive driving method disclosed herein, the data voltage signal and the scan voltage signal can respectively be applied to a same side or a different side of the liquid crystal layer, such that the liquid crystal molecules are driven to deflect.

It should be noted that the display panel 100 can comprise a plurality of first signal lines SL1 and a plurality of second signal lines SL2. One first signal line SL1 can be electrically connected to the first control sub-electrodes 112a of a same column, and one second signal line SL2 can be electrically connected to the second control sub-electrodes 112b of a same row.

According to some embodiments of the display panel shown in FIG. 5B, the liquid crystal light valve portion is an active liquid crystal light valve portion. Herein, the active liquid crystal light valve portion has advantages such as easiness to control, and meanwhile, the driving of the liquid crystal light valve array may not be strictly synchronized with the image capturing. In practice, whether an active liquid crystal light valve portion or an inactive liquid crystal light valve portion is chosen can be based on practical needs.

As shown in FIG. 5B, the display panel 100 further comprises a first signal line SL1, a second signal line SL2, and a first switch component 16 (as illustrated by the circle with dotted line in FIG. 5B). A first terminal of the first switch component 16 is electrically connected to the first signal line SL1 to receive a data voltage signal therefrom; a second terminal of the switch component 16 is electrically connected to one first control sub-electrode 112a; and a control terminal of the first switch component 16 is electrically connected to a second signal line SL2 to receive a scan voltage signal therefrom. Herein, optionally, the first switch component 16 comprises a thin film transistor.

It should be noted that the display panel 100 may comprise a plurality of first signal lines SL1, a plurality of second signal lines SL2, and a plurality of first switch components 16, as illustrated in FIG. 5B. The plurality of switch components 16 correspond to the plurality of liquid crystal light valve portions in a one-to-one relationship to thereby realize that that each liquid crystal light valve portion is controlled separately.

The plurality of first switch components 16 are further arranged in an array, with one first signal line SL1 electrically connected to one first switch component 16 of a same column, and with one second signal line SL2 electrically connected to one first switch component 16 of a same row.

With further reference to FIG. 5B, the display panel 100 further comprises a third signal line (not shown in the figure). The third signal line can be electrically connected to the second control sub-electrode 112b, and it is configured to transmit a common voltage signal to the second control sub-electrode 112b.

As such, in the above active driving method, the data voltage signal and the common voltage signal are respectively applied to a same side or a different side of the liquid crystal layer, so that the liquid crystal molecules are driven to deflect.

Herein, in a direction perpendicular to the first substrate 20, each light valve portion 110 can correspond to at least one imaging pixel 120. That is, the resolution of the plurality of light valve portions 110 in the light valve array 11 can be smaller than the resolution of the plurality of imaging pixels 120 in the imaging array 12 in the display panel.

With reference to FIG. 5A and FIG. 5B, each liquid crystal light valve portion corresponds to two imaging pixels 120, and as such, in the direction perpendicular to the first substrate 20, the orthographic projection of a light valve portion 110 on the first substrate 20 can completely overlap with the orthographic projections of the two imaging pixels 120 on the first substrate 20.

Herein, it should be noted that in order to clearly illustrate each component, in FIG. 5A and FIG. 5B, the orthographic projection of the light valve portion 110 on the first substrate 20 and the orthographic projections of the two imaging pixels 120 on the first substrate 20 are not shown to be completed overlapped.

As shown in FIG. 5A and FIG. 5B, a first driver 30 is electrically connected to the plurality of first signal lines SL1 as a data voltage signal providing circuit to provide the data voltage signals to the plurality of first signal lines SL1. A second driver 31 is electrically connected to the plurality of second scan signal lines SL2 as a scan voltage signal providing circuit to provide the scan voltage signals to the plurality of second signal lines SL2. The second driver 31 can be further electrically connected to the third signal line to provide the common voltage signals to the plurality of third signal lines.

In some embodiments shown in FIG. 5A and FIG. 5B, when the imaging array 12 is an active pixel imaging array, the display panel 100 further comprises a signal reading circuit (not shown in figures), a second switch component 17, a fourth signal line SL4, and a fifth signal line SL5. The second switch component 17, the fourth signal line SL4, and the fifth signal line SL5 are all arranged over the first substrate 20.

A first terminal of the second switch component 17 is electrically connected to the fourth signal line SL4; a second terminal of the second switch component 17 is electrically connected to an imaging pixel 120; and a control terminal of the second switch component is electrically connected to the fifth signal line SL5. The fourth signal line SL4 is electrically connected to the signal reading circuit, and the signal reading circuit is configured to read the electrical signals of corresponding imaging pixel 120.

Herein, optionally, the second switch component 17 can further comprise a thin film transistor.

According to some embodiments illustrated in FIG. 5A or FIG. 5B, the first driver 30 is further configured to be electrically connected to the fourth signal line SL4 to read the electrical signals obtained from the fourth signal line SL4, and the second driver 31 is further configured to be electrically connected to the fifth signal line SL5 to provide the scan voltage signals to the fifth signal line SL5.

According to some embodiments, the signal reading circuit can be integrated in the first driver 30.

According to some other embodiments, the driver circuit that drives the imaging array 12 (including, for example, a scan circuit and a signal reading circuit) can be configured to be separate from the driver circuit that drives the light valve array 11.

With further reference to FIG. 6A, because of the deflection of the liquid crystal molecules, the amount of lights transmitted through different liquid crystal light valve portions are different, and as such, a first mask pattern can be formed in the light valve array 11.

In a first mask pattern provided by an embodiment of the present disclosure, some liquid crystal light valve portions 110 of the liquid crystal light valve array 11 are in a light-blocking state (i.e. the portions corresponding to the black squares in FIG. 6A). The rest of the liquid crystal light valve portions of the liquid crystal light valve array are in a first light-transmitting sub-state (i.e. the portions corresponding to the white squares in FIG. 6A), that is, the light transmittance of the rest of the liquid crystal light valve portions of the liquid crystal light valve array is 100%.

It should be noted that the first mask pattern in FIG. 6A is only a simple illustration, and it does not represent the first mask pattern in practical applications. In practical applications, the specific shape of the first mask pattern can be designed according to practical needs, and there are no limitations herein. In one example, a first mask pattern formed by the liquid crystal light valve array 11 is shown in FIG. 6B.

In practical applications, the first mask pattern can be optimized according to the algorithms of the backend processor based on indicators such as computation load.

For example, in order to form the specific first mask pattern shown in FIG. 6A, the liquid crystal light valve array 11 needs to be driven by a driving circuit. In embodiments of the display panel where the liquid crystal light valve array is an inactive liquid crystal light valve array as illustrated in FIG. 5A, the driving method of the inactive liquid crystal light valve array needs to be synchronized with the image acquiring circuit (that is, the driving circuit of the imaging array).

Figure 7A:
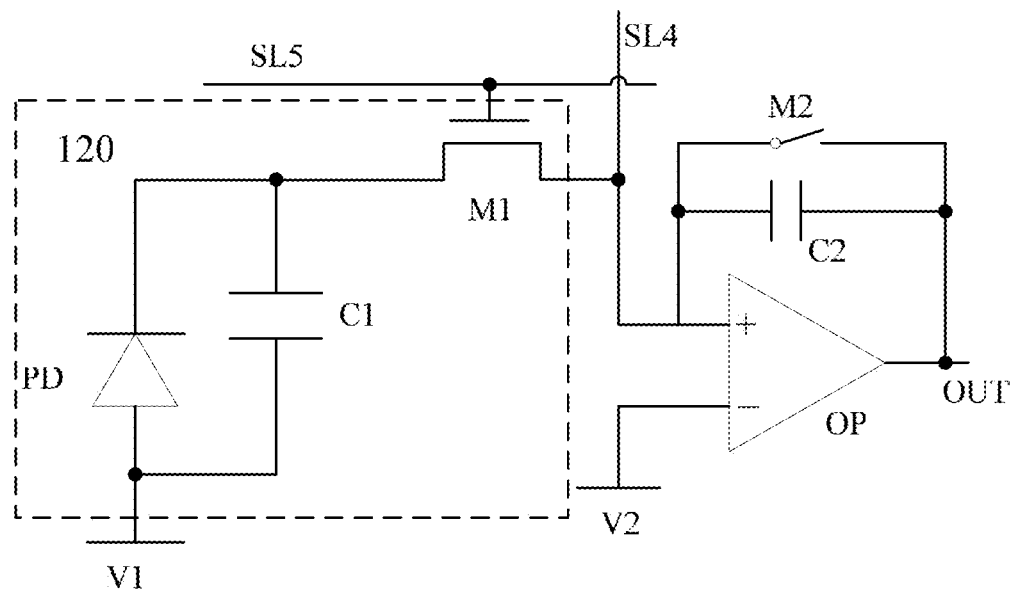
FIG. 7A is a diagram illustrating the structure of an imaging pixel of an imaging array provided by an embodiment of the present disclosure.
Figure 7B:
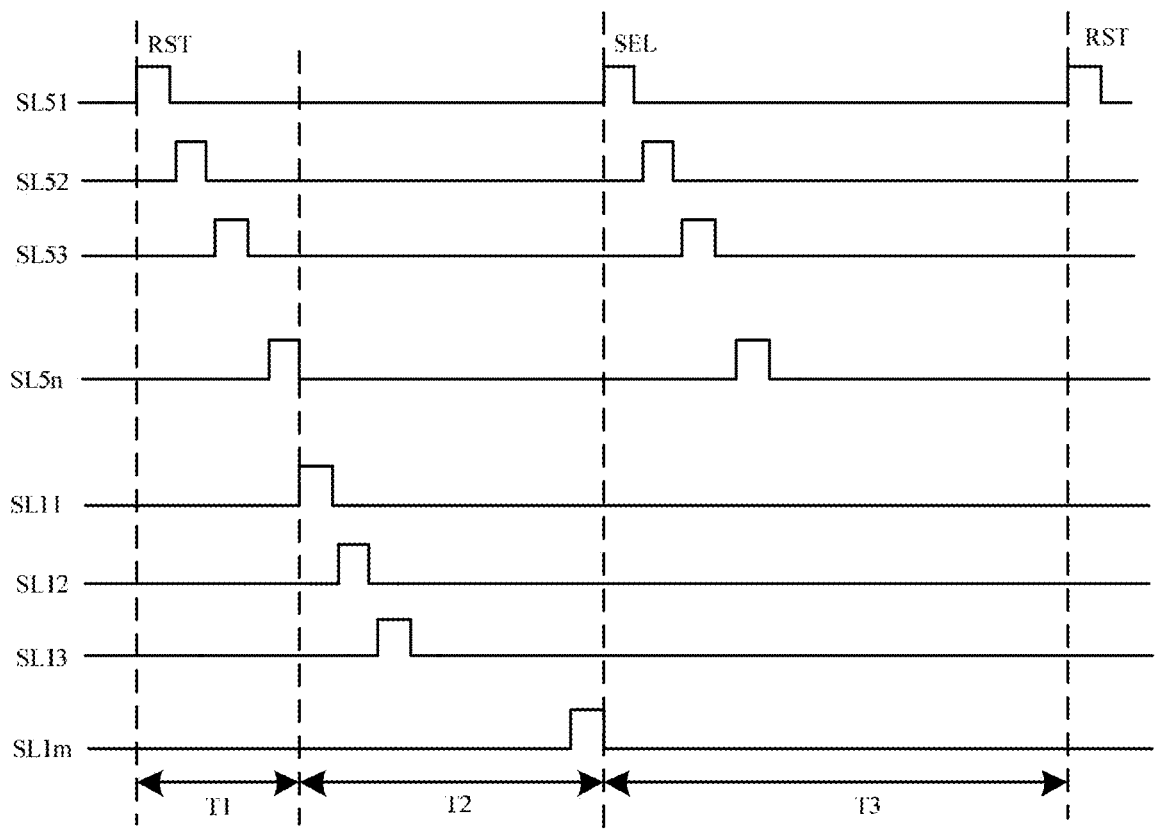
FIG. 7B is a driving time sequence diagram of a liquid crystal light valve array and an imaging array provided by an embodiment of the present disclosure.

FIG. 7A is a schematic view of an imaging pixel in the imaging array provided by some embodiments of the present disclosure, and FIG. 7B is a time sequence diagram of a liquid crystal light valve array and an imaging array provided by some embodiment of the present disclosure.

According to some embodiments shown in FIG. 7A, the imaging pixel 120 (indicated by the box with dotted lines) comprises a photo-sensitive diode PD and a first capacitor C1. The photo-sensitive diode PD is configured to convert an optical signal into an electric signal, and the first capacitor C1 is configured to store the electric signal generated by the photo-sensitive diode PD.

A first terminal of the photo-sensitive diode PD is electrically connected to a first terminal of the first capacitor C1. A second terminal of the photo-sensitive diode PD is electrically connected to a first power source terminal V1. A second terminal of the first capacitor C1 is also electrically connected to the first power source terminal V1.

Furthermore, the second switch component can comprise a thin film transistor M1. A first terminal of the thin film transistor M1 is electrically connected to a fourth signal line SL4. A second terminal of the thin film transistor M1 is electrically connected to the first terminal of the photosensitive diode PD. A control terminal of the thin film transistor M1 is electrically connected to a fifth signal line SL5.

It is noted that the circuit structure of the imaging pixel of embodiments of the present disclosure is not limited to the structure shown in FIG. 7A, which can further comprise a resetting transistor, an amplifier transistor, a compensation circuit, etc., according to practical needs.

According to some embodiments illustrated in FIG. 7A, the signal reading circuit comprises an amplifier OP, a second capacitor C2 and a resetting switch M2. The fourth signal line SL4 is electrically connected to a non-inverting input terminal of the amplifier OP of the signal reading circuit. An inverting input terminal of the amplifier OP is electrically connected to the second power source terminal V2.

A first terminal of the second capacitor C2 is electrically connected to the non-inverting input terminal of the amplifier OP, and a second terminal of the second capacitor C2 is electrically connected to the output terminal of the amplifier OP (i.e. "OUT" in FIG. 7A). A first terminal of the resetting switch M2 is electrically connected to the non-inverting input terminal of the amplifier OP; and a second terminal of the resetting switch M2 is electrically connected to the output terminal of the amplifier OP. It is noted that the circuit structure of the signal reading circuit of embodiments of the present disclosure is not limited to the structure in FIG. 7A.

Optionally, a first voltage signal outputted by the first power source terminal V1 can be smaller than a second voltage signal outputted by the second power source terminal V2. In an illustrating embodiment, the first voltage signal can be about −4 V, and the second voltage signal can be about 1 V.

With reference to FIG. 7B, according to some embodiments of the display panel, the imaging array 12 can comprise n rows of imaging pixels, and the liquid crystal light valve array can comprise m rows of liquid crystal light valve portions.

The fifth signal line SL51 is electrically connected to the imaging pixels of the first row; the fifth signal line SL52 is electrically connected to the imaging pixels of the second row; the fifth signal line SL53 is electrically connected to the imaging pixels of the third row, and so on. The fifth signal line SL5$n$ is electrically connected to the imaging pixels of the n$^{th}$ row.

The first signal line SL11 is electrically connected to the liquid crystal light valve portions of the first row; the first signal line SL12 is electrically connected to the liquid crystal light valve portions of the second row; the first signal line SL13 is electrically connected to the liquid crystal light valve portions of the third row, and so on. The first signal line SL1$m$ is electrically connected to the liquid crystal light valve portion of the m$^{th}$ row.

According to some embodiments, as shown in FIG. 7B, during a resetting stage T1, the photo-sensitive diode PD of the imaging pixel is reset. Take the imaging pixels of the first row as an example, the fifth signal line SL51 transmits a resetting control signal RST to the control electrode of the thin film transistor M1, and the resetting control signal RST can control the thin film transistor M1 to be turned on. Meanwhile, the resetting switch M2 is also turned on. Therefore, the second voltage signal outputted by the second power source terminal V2 is transmitted to the first terminal of the photo-sensitive diode PD through the thin film transistor M1 to thereby reset the first terminal of the photo-sensitive diode PD. As such, the resetting control signal RST can in turn be applied to each fifth signal line, such that the photo-sensitive diodes in all imaging pixels of the display panel can be reset.

With further reference to FIG. 7B, during a signal obtaining stage T2, also take the liquid crystal light valve portions of the first row as an example. The data voltage signal transmitted by the first signal line SL11 is transmitted to the first control sub-electrode of the liquid crystal light valve portions, and the scan voltage signal transmitted by the second signal line that is electrically connected to the liquid crystal light valve portions of the first row is transmitted to the second control sub-electrode of the liquid crystal light valve portions, such that the state of the liquid crystal light valve portions can be controlled. This above control can similarly be applied to the liquid crystal light valve portions of other rows, such that the control of all liquid crystal light valve portions of the display panel can be realized, thereby the liquid crystal light valve array can form the first mask pattern.

Also during the signal obtaining stage T2, the photo-sensitive diode PD of the imaging pixel receives an optical signal and converts the optical signal into an electric signal, which is stored in the first capacitor C1.

It should be noted that during the signal obtaining stage T2, all liquid crystal light valve portions of the display panel can be scanned. That is, the signal obtaining stage T2 comprises a row scan period for all liquid crystal light valve portions. Herein, the row scan period represents the duration period starting from the scanning of the first row of liquid crystal light valve portions to the scanning of the last row of liquid crystal light valve portions.

With further reference to FIG. 7B, during a signal reading stage T3, take the imaging pixels of the first row as an example. The fifth signal line SL51 transmits a reading control signal SEL to the control electrode of the thin film transistor M1 to control the thin film transistor M1 to be turned on. At this time, the resetting switch M2 is turned off. The electric signal stored in the first capacitor C1 is transmitted to the output terminal of the amplifier OP through the second capacitor C2, therefore the electric signal can be read. The intermediate image can thus be obtained through combining the electric signals generated by all imaging pixels in the imaging array.

It should be noted that herein the imaging pixels shown in FIG. 7A and the driving time sequence shown in FIG. 7B are only one illustrating embodiment of the present disclosure.

According to some embodiments of the display panel, the light valve array 11 can be an electronic ink light valve array, and each light valve portion 110 is an electronic ink light valve portion.

Figure 8A:
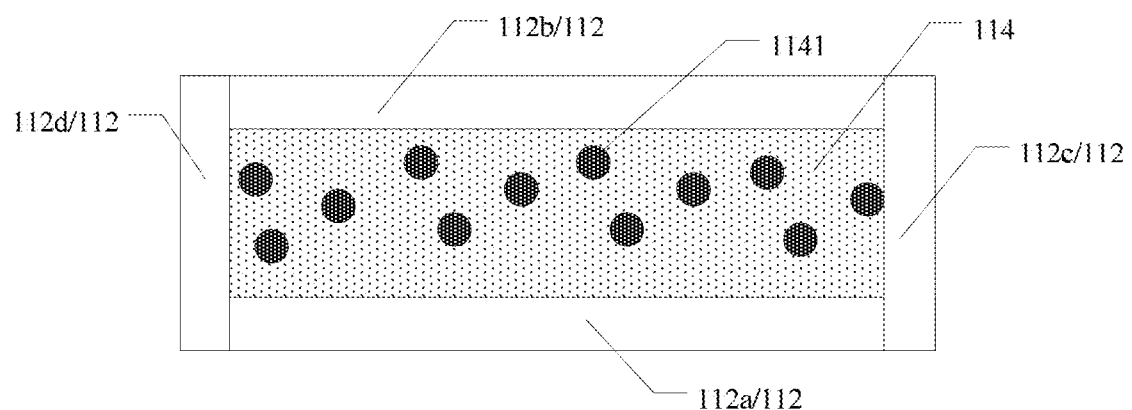
FIG. 8A is a schematic view of an electronic ink portion of an electronic ink light valve array provided by an embodiment of the present disclosure.
Figure 8B:
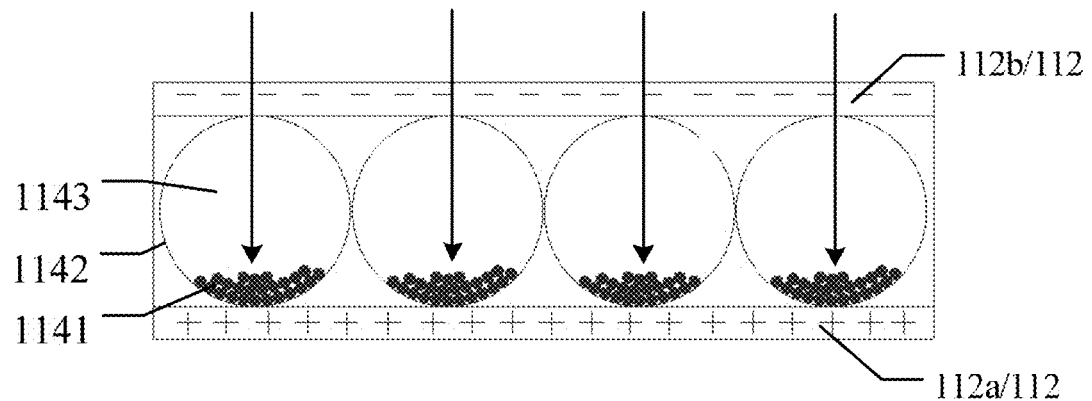
FIG. 8B is a schematic view of the structure of a portion of an electronic ink light valve array provided by an embodiment of the present disclosure.
Figure 8C:
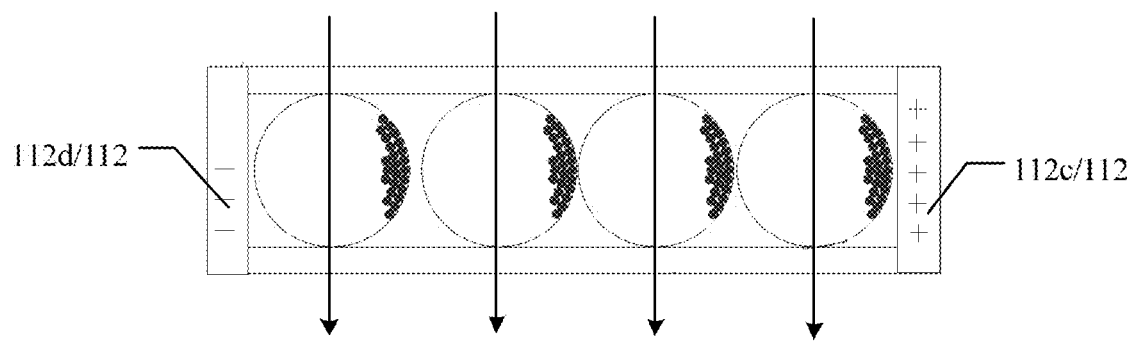
FIG. 8C is a schematic view of another structure of a portion of another electronic ink light valve array provided by an embodiment of the present disclosure.

FIG. 8A is a schematic view of an electronic ink portion of an electronic ink light valve array provided by an embodiment of the present disclosure. FIG. 8B is a partial view of an electronic ink portion of an electronic ink light valve array provided by one embodiment of the present disclosure. FIG. 8C is a partial view of an electronic ink portion of an electronic ink light valve array provided by yet another embodiment of the present disclosure.

As shown in FIG. 8A, the electronic ink light valve portion comprises an electronic ink layer 114 and a control electrode 112. The electronic ink layer 114 comprises charged light-blocking particles 1141. The control electrode 112 is configured to control the distributions of the charged light-blocking particles 1141 in the electronic ink layer 114 to thereby adjust the light transmittance of the electronic ink light valve portions.

Specifically, after a voltage is applied to the control electrode 112, the electric field generated by the control electrode 112 enables the charged light-blocking particles 1141 to move inside the electronic ink layer 114, and consequently, the distribution of the charged light-blocking particles 1141 in the electronic ink layer 114 can be adjusted, and the light transmittance of the electronic ink light valve portions can be controlled.

As shown in FIG. 8B and FIG. 8C, the electronic ink layer 114 comprises a plurality of capsules 1142. An electrophoresis fluid 1143 and charged light-blocking particles 1141 are filled inside each of the plurality of capsules 1142, and the charged light-blocking particles 1141 are suspended in the electrophoresis fluid 1143.

The plurality of capsules 1142 are arranged side by side. As such, during the process of switching the light transmittance rate of a light valve portion, the moving distance of the charged light-blocking particles 1141 can be reduced, the response time of the electronic ink light valve portion can also be reduced, and the local accumulation of the charged light-blocking particles 1141 can also be reduced. It is advantageous for the even distribution of the charged light-blocking particles 1141 in the electronic ink layer 114, and the accuracy of the light transmittance of the electronic ink light valve portion can be better adjusted.

As further shown in FIG. 8B and FIG. 8C, the control electrode 112 comprises a first control sub-electrode 112a, a second control sub-electrode 112b, a third control sub-electrode 112c, and a fourth control sub-electrode 112d.

The first control sub-electrode 112a and the second control sub-electrode 112b are arranged to opposingly face each other, and in a direction perpendicular to the first substrate 20, the first control sub-electrode 112a and the second control sub-electrode 112b are respectively configured over the two main surfaces of the electronic ink layer 114. The third control sub-electrode 112c and the fourth control sub-electrode 112b are arranged to opposingly face each other, and in a direction parallel to the first substrate 20, the third control sub-electrode 112c and the fourth control sub-electrode 112d are respectively configured over the two side surfaces of the electronic ink layer 114.

Herein each of the two main surfaces of the electronic ink layer 114 is substantially a surface of the electronic ink layer 114 that is parallel to the first substrate 20, and each of the two side surfaces of the electronic ink layer 114 is substantially a surface of the electronic ink layer 114 that is perpendicular to the first substrate 20.

As a result, through controlling the voltages applied on the first control sub-electrode 112a, the second control sub-electrode 112b, the third control sub-electrode 112c and the fourth control sub-electrode 112d, the charged light-blocking particles 1141 can accumulate towards one of the two main surfaces of the electronic ink layer 114, such that the light transmittance of the electronic ink light valve portion can be reduced; or alternatively, the charged light-blocking particles 1141 can accumulate towards one of the two side surfaces of the electronic ink layer 114, such that the light transmittance of the electronic ink light valve portion can be increased (i.e. the electronic ink light valve portion is in a light-transmitting state).

According to some embodiments, the first control sub-electrode 112a, the third control sub-electrode 112c, and the fourth control sub-electrode 112d are all arranged on the first substrate 20, whereas the second control sub-electrode 112b is arranged on the second substrate 21. Furthermore, the first control sub-electrode 112a, the second control sub-electrode 112b, the third control sub-electrode 112c and the fourth control sub-electrode 112d are insulated from one another.

Herein, with reference to FIG. 8B and FIG. 8C, in the electronic ink light vale portion, the charged light-blocking particles 1141 can be negatively charged.

As shown in FIG. 8B, when a positive voltage is applied over the first control sub-electrode 112a, and a negative voltage is applied to the second control sub-electrode 112b, an electric field having a direction from the first control sub-electrode 112a to the second control sub-electrode 112b can be formed. The negatively charged light-blocking particles 1141 can thus accumulate at a side of each capsule 1142 that is close to the first control sub-electrode 112a. Thereby, lights transmitted by the light valve array 11 cannot pass through the electronic ink light valve portion, and the electronic ink light valve portion is in a light-blocking state.

As shown in FIG. 8C, a positive voltage is applied to the third control sub-electrode 112c and a negative voltage is applied to the fourth control sub-electrode 112d, thus an electric field having a direction from the third control sub-electrode 112c to the fourth control sub-electrode 112d can be formed. The negatively charged light-blocking particles 1141 can thus accumulate at a side of each capsule 1142 that is close to the third control sub-electrode 112c. Thereby, lights transmitted by the light valve array 11 can pass through the electronic ink light valve portion, and the electronic ink light valve portion is in a light-transmitting state.

It should be noted that the charged light-blocking particles 1141 in the electronic ink light valve portion can alternatively be positively charged. As such during the working process, corresponding voltages can be applied to the first control sub-electrode 112a, the second control sub-electrode 112b, the third control sub-electrode 112c and the fourth control sub-electrode 112d based on practical requirements, and it will not be repeated herein.

In addition, there are no limitations to the configuration of the control electrode in the electronic ink light valve in the present disclosure, as long as the control electrode can switch among different light transmittance of the electronic ink light valve portion.

According to some other embodiments of the display panel disclosed herein, the light valve array 11 can be an electrochromic light valve array, and each light valve portion 110 is an electrochromic light valve portion.

Figure 9:
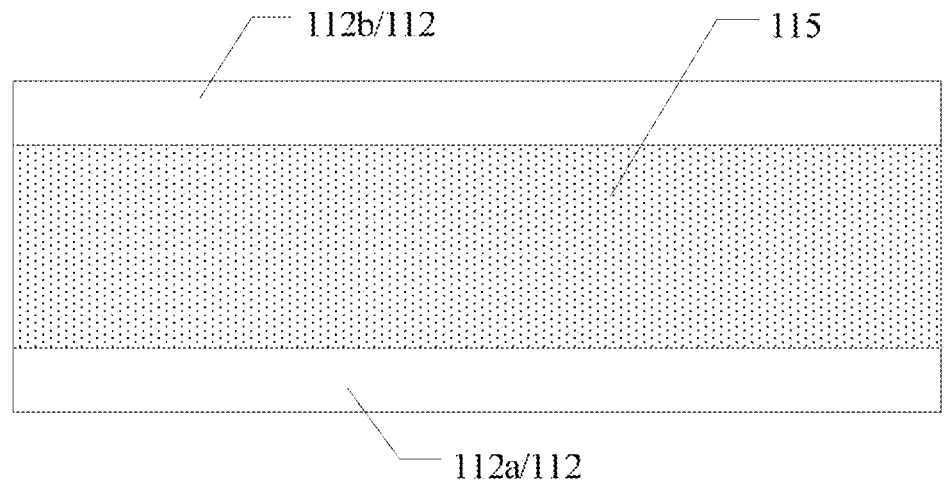
FIG. 9 is a schematic view of an electrochromic light valve portion of an electrochromic light valve array provided by an embodiment of the present disclosure.

FIG. 9 is a schematic view of an electrochromic light valve portion of an electrochromic light valve array provided by an embodiment of the present disclosure. As shown in FIG. 9, the electrochromic light valve portion comprises an electrochromic layer 115 and a control electrode 112. The control electrode 112 is configured to apply a voltage thereon to thereby adjust the light transmittance of the electrochromic layer 115. The control electrode 112 comprise a first control sub-electrode 112a and a second control sub-electrode 112b. The first control sub-electrode 112a and the second control sub-electrode 112b are insulated from each other.

In a direction that is perpendicular to the first substrate 20, the first control sub-electrode 112a and the second control sub-electrode 112b are respectively arranged at two opposing surfaces (i.e. a top surface and a bottom surface) of the electrochromic layer 115. Voltages can be applied on the first control sub-electrode 112a and the second control sub-electrode 112b, and as a result, the light transmittance of the electrochromic layer 115 can be changed, such that the electrochromic light valve portion can have different light transmittance rates.

The first control sub-electrode 112a can be arranged on the first substrate 20, whereas the second control sub-electrode 112b can be arranged on the second substrate 21.

There are no limitations to the material of the electrochromic layer 115 in the present disclosure. For example, the electrochromic material can comprise a material such as tungsten trioxide, polythiophene and its derivatives, viologen, tetrathiafulvalene, or a metal phthalocyanine compound, etc.

It should be noted that the above descriptions of the liquid crystal light valve array can also be applied to the description of the electrochromic light valve array and electronic ink light valve array where there are no conflicts. For example, the electrochromic light valve array can also comprise an active electrochromic light valve array or an inactive electrochromic light valve array, and the electronic ink light valve array can also comprise an active electronic ink light valve array or an inactive electronic ink light valve array.

With further reference to FIG. 3, an object 19 is arranged over a surface (i.e. a top surface in the figure) of the third substrate 22 that is far away from the second substrate 21. Lights from the object 19 can reach over the display panel 100 and further pass through the displaying array 13 and the light valve array 11 to be transmitted to the imaging array 12, and as such, an intermediate image of the object 19 can be generated over the imaging array 12.

In the following, with reference to FIG. 3, FIG. 10 and FIG. 11, the major principles of the imaging methods and mathematic expressions will be described in detail.

Figure 10:
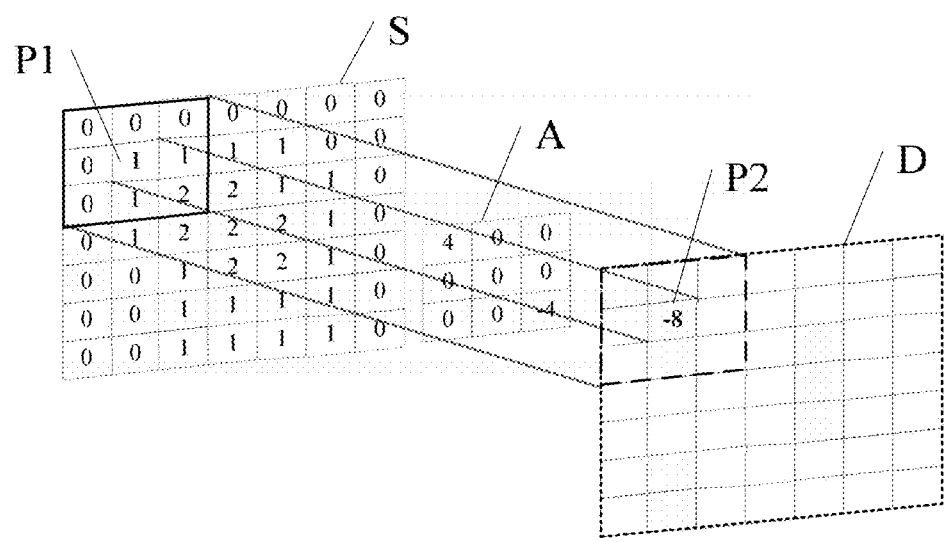
FIG. 10 is a schematic view of a convolution operation provided by an embodiment of the present disclosure.
Figures 11, 12:
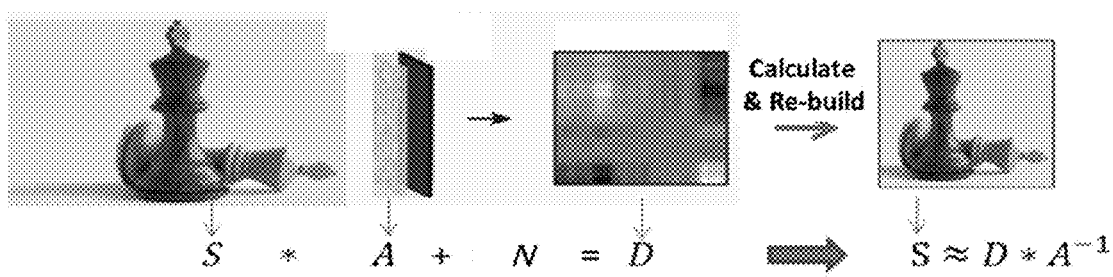
FIG. 11 is a schematic view of a mathematical model provided by an embodiment of the present disclosure.
FIG. 12 is a schematic view of a display apparatus provided by an embodiment of the present disclosure.

FIG. 10 is a schematic view of a convolution operation provided by an embodiment of the present disclosure, and FIG. 11 is a schematic view of a mathematic model provided by an embodiment of the present disclosure.

The object 19 is abstracted to a two-dimensional image, and the light valve array 11 and the displaying array 13 are between the object 19 and the imaging array 12. The light valve array 11 forms a first mask pattern, and the displaying array 13 forms a second mask pattern.

The mathematic models of the first mask pattern and the second mask pattern can be obtained through experiments, the mathematic model is a point spread function. According to optical principles, the intermediate image of the object 19 formed over the image array 12 is the convolution of the object image (i.e. the aforementioned two-dimensional image) and the point spread function.

In a specific embodiment shown in FIG. 10, the object image is S, the mathematic model of the mask pattern (Herein, the mask patterns comprises the first mask pattern and the second mask pattern) is A, the intermediate image is D. A point P1 on the object image S, after passing through the mask pattern A, becomes the point P2 on the intermediate image D. The data for the point P2 on the intermediate image D can be obtained through convolution calculation, and the calculation formula is as follows:

$$0*4+0*0+0*0+0*0+1*0+1*0+0*0+0*1+2*(-4)=-8;$$

That is, the data of the point P2 is −8.

As further shown in FIG. 11, based on the above convolution calculation formula, the intermediate image D can be represented as follows:

$$S*A+N=D;$$

where N represents the noise of the whole system, and "*" represents the convolution. That is, the corresponding elements that are located at the same position between the two matrices are multiplied.

Then, the intermediate image can be processed through a backend processor to restore the captured image of the object 19.

If the influence of the noise can be ignored, the captured image can be represented as:

$$S \approx D*A^{-1};$$

where $A^{-1}$ represents the inverse matrix of A. That is, $$A*A^{-1}=E;$$

where E represents unit matrix.

For example, in the present disclosure, as shown in FIG. 3, the lights from the object 19 in turn passes through the displaying array 13 and the light valve array 11, and finally forms the intermediate image over the imaging array 12. The first mask pattern may be represented as A1, and the second mask pattern may be represented as A2. Hence, the intermediate image may be represented as follows:

$$S*A1*A2+N=D;$$

Then, the captured image of the object 19 (i.e. the captured image is the same as the object image S) can be obtained through decoding. The captured image is represented as follows:

$$S \approx D*A1^{-1}*A2^{-1}.$$

In some embodiments of the present disclosure, the light valve array 11 is configured as the first mask pattern, and the light valve array 11 may not influence the display image of the displaying array 13. In addition, the light valve array 11 may be controlled in real-time, therefore the required first mask pattern may be obtained. Thereby, the methods to obtain the first mask pattern can be flexible and simple.

On the other hand, the light valve array 11 can be controlled to form different first mask patterns, and the different first mask patterns may correspond to different imaging distance of the object 19. That is, different first mask patterns has different depths of the field range. Therefore, through an approach of time-share multiplexing or space-share multiplexing, the captured image of the object 19 can be obtained, and the depth (or distance) from the object 19 to the display panel may also be obtained.

In a second aspect, the present disclosure further provides a display apparatus.

The display apparatus comprises a display panel according to any one the embodiments of the display panel as described above.

FIG. 12 is a schematic view of a display apparatus provided by an embodiment of the present disclosure. As shown in FIG. 12, the display apparatus 200 provided comprise any one of the display panels 100 provided by any aforementioned embodiments.

The display apparatus 200 further comprises a first driver (the first driver 30 shown in FIG. 5A and FIG. 5B) and a second driver (the second driver 31 shown in FIG. 5A and FIG. 5B). The first driver is configured to provide a first data voltage signal to the light valve array, and the second driver is configured to provide a first scan voltage signal to the light valve array. The first data voltage signal and the first scan voltage signal are configured to control the light valve array to form the first mask pattern.

The display apparatus 200 can further comprise a third driver and a fourth driver. The third driver is configured to provide a second data voltage signal to the displaying array, and the fourth driver is configured to provide a second scan voltage signal to the displaying array. The second data voltage signal and the second scan voltage signal are configured to control the displaying array to display image.

According to some embodiments, the first driver and the third driver can be integrated with each other, whereas the second driver and the fourth driver can be integrated with each other. It is noted that there are no limitations herein, and the first driver and the third driver can be separated from each other, or the second driver and the fourth driver can be separated from each other.

Herein, the display apparatus 200 can be any products or components that have display function such as mobile phones, tablets, televisions, monitors, laptops, digital frames or navigators.

It should be noted that other components of the display apparatus 200 (for example, control device, image data coding/decoding device, clock circuit, and so on) are well known by persons skilled in the art, and will not be repeated herein.

In a third aspect, the present disclosure further provides an imaging method. The imaging method can be applied to any of the display panels provided by the present disclosure.

Figure 13:
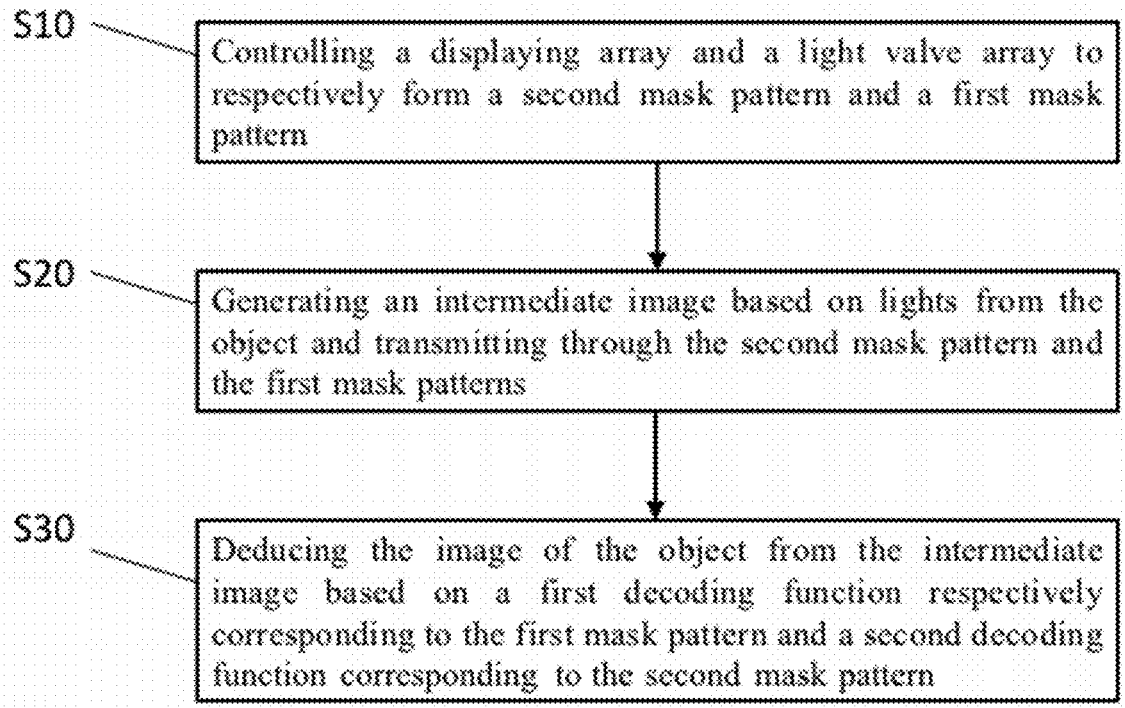
FIG. 13 is a flow chart of an imaging method provided by an embodiment of the present disclosure.

FIG. 13 is a flow chart of an imaging method provided by an embodiment of the present disclosure. As shown in FIG. 13, the imaging method comprises the following steps:

S10: Controlling a displaying array and a light valve array to respectively form a second mask pattern and a first mask pattern;

S11: Generating an intermediate image based on lights from the object and transmitting through the second mask pattern and the first mask patterns;

S12: Deducing the image of the object from the intermediate image based on a first decoding function respectively corresponding to the first mask pattern and a second decoding function corresponding to the second mask pattern.

In step S10, the first mask pattern can be designed according to practical applications. The state of each light valve portion in the light valve array can be obtained through the first mask pattern (i.e. the light-blocking state or the light-transmitting state). The data voltage signal and the scan voltage signal are applied to the control electrode of the light valve portion through the first driver and the second driver so that the light valve portions will be in corresponding states, and as such, the first mask pattern is obtained.

In step S11, the displaying array over the display panel forms the second mask pattern, which remains unchanged during the imaging process. The lights from the object may in turn passes through the second mask pattern and the first mask pattern to be transmitted to the imaging array to thereby generate the intermediate image of the object. That is, the intermediate image is modulated by the mask pattern including the first mask pattern and the second mask pattern.

Herein the lights from the object can be reflected lights that result from the light being reflected diffusely by the object, or can be lights that are emitted by the object.

In step S12, different first mask patterns can correspond to different first decoding functions.

It should be noted that the descriptions of major principles and mathematic expressions regarding the first mask pattern, the second mask pattern and imaging method may reference to the relevant descriptions in the embodiments of the display panel, and will not be repeated herein.

In a fourth aspect, the present disclosure further provides a depth detection method. Herein the display panel can be based on any one the embodiments of the display panel as described above.

Figure 14:
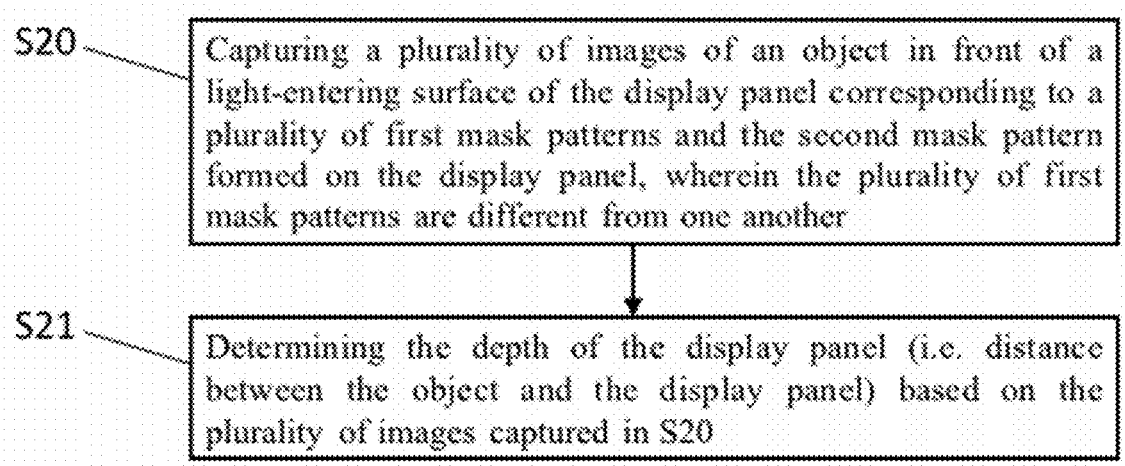
FIG. 14 is a flow chart of a depth detection method provided by some embodiments of the present disclosure.

FIG. 14 is a flow chart of a depth detection method provided by an embodiment of the present disclosure. As shown in FIG. 14, the depth detection method comprises the following steps:

S20: Capturing a plurality of images of an object in front of a light-entering surface of the display panel corresponding to a plurality of first mask patterns and the second mask pattern formed on the display panel, wherein the plurality of first mask patterns are different from one another;

S21: Determining the depth of the display panel (i.e. distance between the object and the display panel) based on the plurality of images captured in S20.

In step S20, the plurality of first mask patterns can be configured to be different from one another, and the plurality of first mask patterns correspond to different imaging distances of the object. The plurality of images correspond to the plurality of first mask patterns in a one-to-one relationship.

Figure 15:
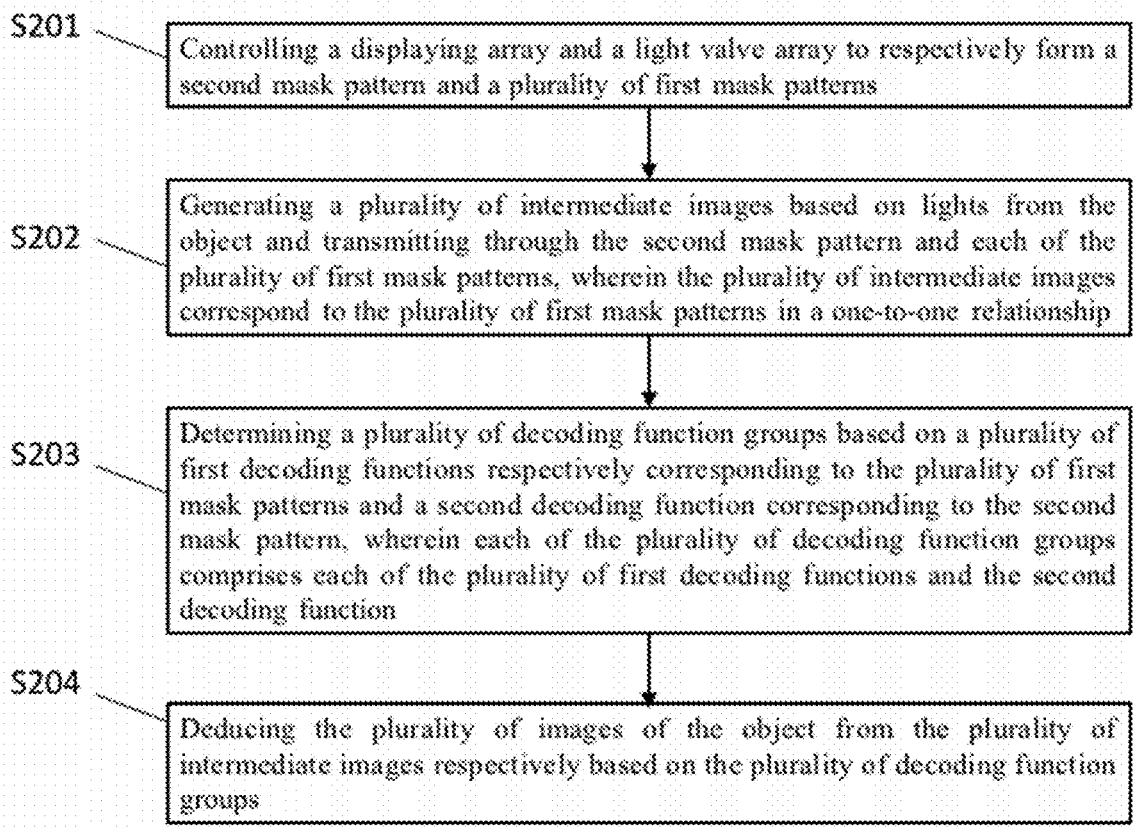
FIG. 15 is a flow chart illustrating the step S20 of the depth detection method shown in FIG. 14 according to some embodiments of the present disclosure.

According to some embodiments of the method, the step S20 of capturing a plurality of images of the object corresponding to a plurality of first mask patterns and the second mask pattern formed on the display panel comprise the following sub-steps, as illustrated in FIG. 15:

S201: controlling a displaying array and a light valve array to respectively form a second mask pattern and a plurality of first mask patterns;

S202: generating a plurality of intermediate images based on lights from the object and transmitting through the second mask pattern and each of the plurality of first mask patterns, wherein the plurality of intermediate images correspond to the plurality of first mask patterns in a one-to-one relationship;

S203: determining a plurality of decoding function groups based on a plurality of first decoding functions respectively corresponding to the plurality of first mask patterns and a second decoding function corresponding to the second mask pattern, wherein each of the plurality of decoding function groups comprises each of the plurality of first decoding functions and the second decoding function; and S204: deducing the plurality of images of the object from the plurality of intermediate images respectively based on the plurality of decoding function groups.

Optionally in the depth detection method described above, in the sub-step S201 of controlling a displaying array and a light valve array to respectively form a second mask pattern and a plurality of first mask patterns, the plurality of first mask patterns can be formed by means of a time-share multiplexing approach, or alternatively can be formed by means of a space-share multiplexing approach.

According to some embodiments, in step S20, a time-share multiplexing approach is adopted to form the plurality of first mask patterns.

More specifically, by means of the approach, the plurality of first mask patterns based on a time sequence are first displayed to thereby form a first mask pattern series, wherein each first mask pattern corresponds to one imaging focal length. Then, a plurality of images can be obtained by decoding based on a plurality of first decoding functions that respectively correspond to the plurality of first mask patterns.

Figure 16A:
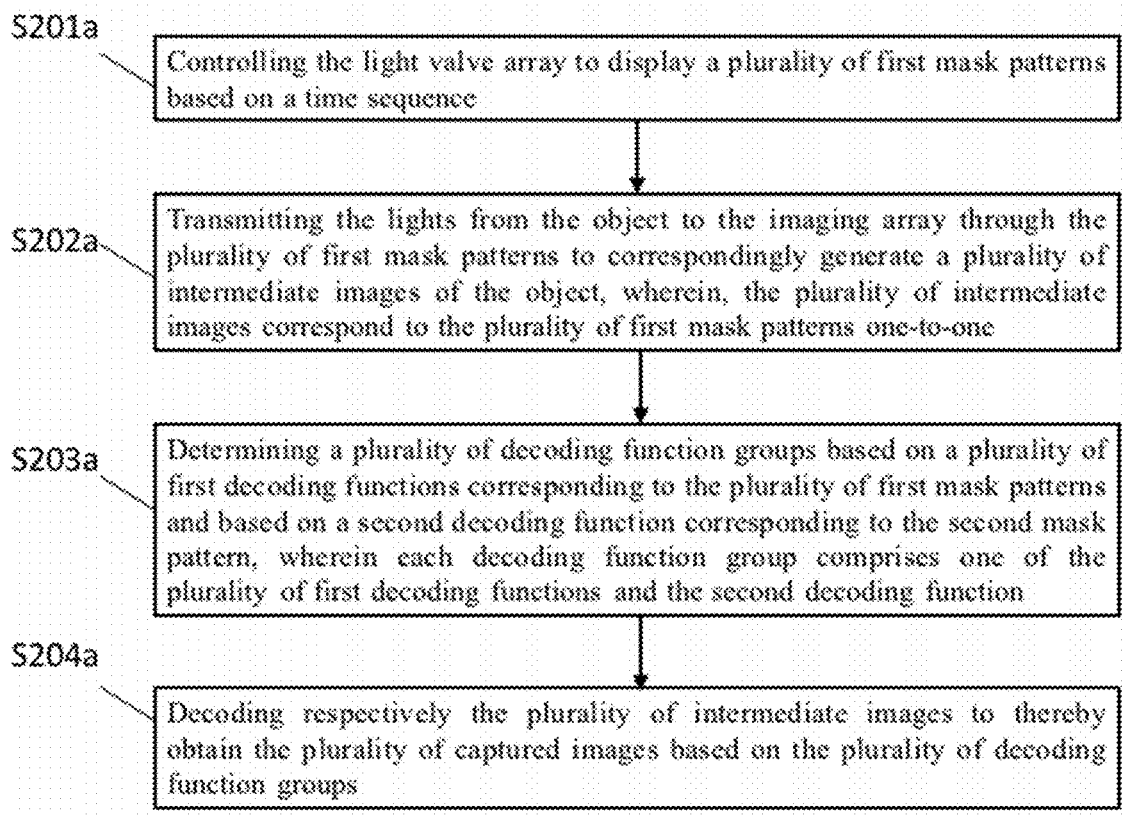
FIG. 16A is a flow chart illustrating the step S20 of the depth detection method shown in FIG. 14 according to some embodiments of the method that adopts a time-share multiplexing approach.

As such, according to the above embodiments of the depth detection method that adopts the time-share multiplexing approach, the step S20 comprises the following sub-steps, as illustrated in FIG. 16A:

S201*a*: Controlling the light valve array to display a plurality of first mask patterns based on a time sequence;

S202a: Transmitting the lights from the object to the imaging array through the plurality of first mask patterns to correspondingly generate a plurality of intermediate images of the object, wherein, the plurality of intermediate images correspond to the plurality of first mask patterns one-to-one;

S203a: Determining a plurality of decoding function groups based on a plurality of first decoding functions corresponding to the plurality of first mask patterns and based on a second decoding function corresponding to the second mask pattern, wherein each decoding function group comprises one of the plurality of first decoding functions and the second decoding function;

S204a: Decoding respectively the plurality of intermediate images to thereby obtain the plurality of captured images based on the plurality of decoding function groups.

According to some embodiments, in step S20, the plurality of first mask patterns are formed by means of a space-share multiplexing approach.

More specifically, the display panel comprises a plurality of mask regions, and the imaging array comprises a plurality of imaging sub-arrays that respectively correspond to the plurality of mask regions in a one-to-one relationship. The light valve array comprises a plurality of light valve sub-arrays that respectively correspond to the plurality of mask regions in a one-to-one relationship, and the plurality of light valve sub-arrays may form a plurality of first mask patterns, and the plurality of first mask patterns correspond to different imaging focal lengths.

It should be noted that after completing the manufacturing of the displaying array, the second mask pattern formed by the displaying array and the second decoding function corresponding to the second mask pattern can be obtained through experiments.

Figure 16B:
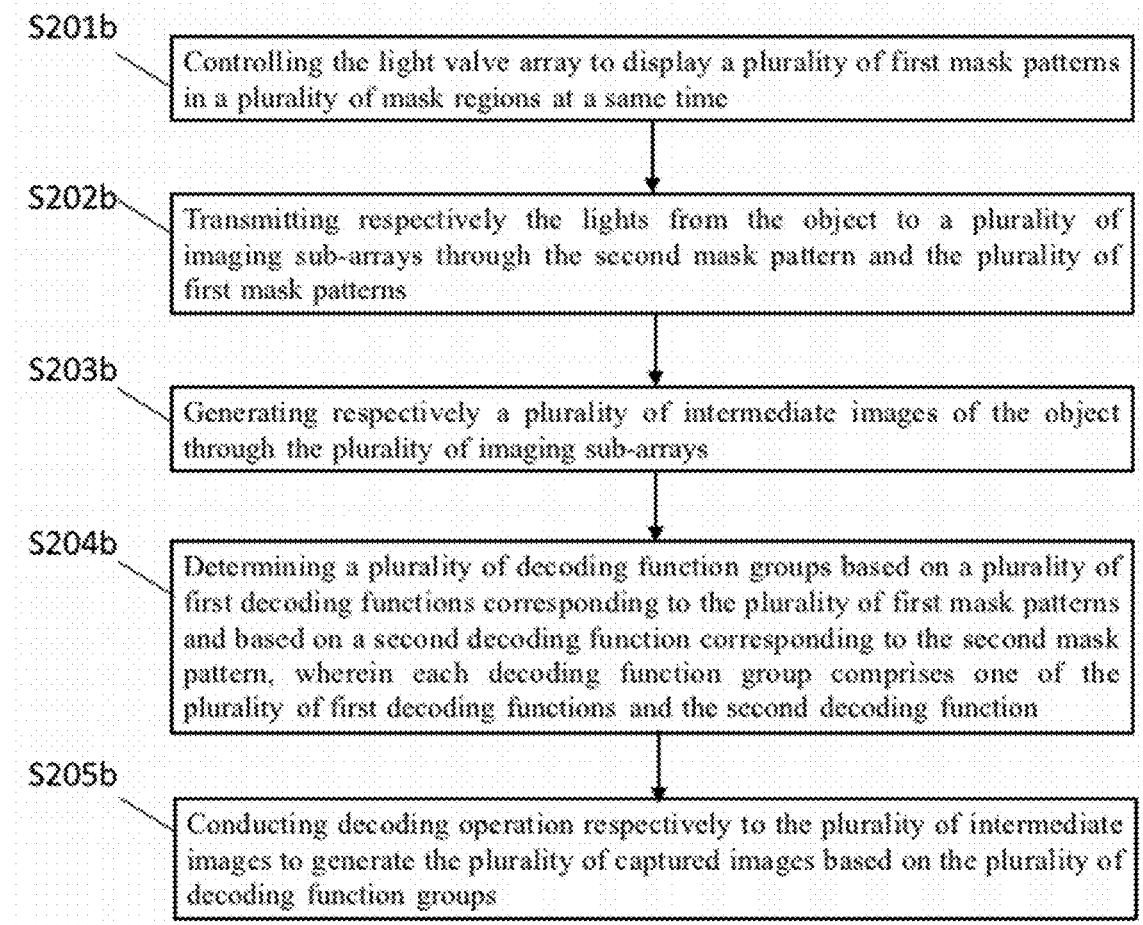
FIG. 16B is a flow chart illustrating the step S20 of the depth detection method shown in FIG. 14 according to some embodiments of the method that adopts a space-share multiplexing approach.

As such, according to the above embodiments of the depth detection method that adopts the space-share multiplexing approach, the step S20 comprises the following sub-steps, as illustrated in FIG. 16B:

S201b: Controlling the light valve array to display a plurality of first mask patterns in a plurality of mask regions at a same time;

S202b: Transmitting respectively the lights from the object to a plurality of imaging sub-arrays through the second mask pattern and the plurality of first mask patterns;

S203b: Generating respectively a plurality of intermediate images of the object through the plurality of imaging sub-arrays;

S204b: Determining a plurality of decoding function groups based on a plurality of first decoding functions corresponding to the plurality of first mask patterns and based on a second decoding function corresponding to the second mask pattern, wherein each decoding function group comprises one of the plurality of first decoding functions and the second decoding function;

S205b: Conducting decoding operation respectively to the plurality of intermediate images to generate the plurality of captured images based on the plurality of decoding function groups.

It should be noted that the plurality of mask regions can be configured according to practical needs, and there are no limitations herein. In addition, each imaging sub-array may generate a complete intermediate image of the object.

Herein, an intermediate image can optionally be obtained thought modulation by a mask pattern formed by on first mask pattern and the second mask pattern. A captured image can be obtained by decoding an intermediate image based on a first decoding function and the second decoding function.

It should be noted that in step S20, during the process of decoding the intermediate image with one of the plurality of first decoding functions and the second decoding function, there are no limitations for the order.

According to some embodiments, the process of decoding the plurality of intermediate images respectively to generate the plurality of captured images of the object comprises:

(1) Decoding the plurality of intermediate images to obtain the plurality of intermediate decoded images according to the second decoding function; and (2) Decoding the plurality of intermediate decoded images respectively to obtain the plurality of captured images according to the plurality of first decoding functions.

Alternatively, the process of decoding the plurality of intermediate images to generate the plurality of captured images according to the plurality of decoding function groups comprises:

(1)': Decoding respectively the plurality of intermediate images to obtain the plurality of intermediate decoded image according to the first decoding function; and (2)': Decoding the plurality of intermediate images to obtain the plurality of captured images according to the second decoding function.

According to some embodiments, one of the plurality of first decoding function and the second decoding function in each decoding function group can constitute a composite decoding function.

As such, the process of decoding respectively the plurality of intermediate images to generate the plurality of captured images of the object according to the plurality of decoding function groups can comprise:

Decoding the plurality of intermediate images respectively to obtain the plurality of captured images based on the plurality of composite decoding functions.

In step S21, the distance from the object to the display panel can be determined based on the clarity of the plurality of captured images. Optionally, the distance corresponding to the clearest captured image among the plurality of captured images can be determined as the distance between the object and the display panel.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. A display panel capable of capturing an image of an object over a light-entering surface thereof, comprising a displaying array, a light valve array, and an imaging array, sequentially below the light-entering surface, wherein:

the light valve array comprises a plurality of light valve portions and is configured to form a plurality of first mask patterns, wherein at least two of the plurality of first mask patterns are different;

the displaying array comprises a plurality of displaying pixels and is configured to form a second mask pattern; and the imaging array comprises a plurality of imaging pixels and is configured to generate an intermediate image upon receiving lights from the object and transmitting through the second mask pattern in the displaying array and at least one of the plurality of first mask patterns in the light valve array, wherein the image of the object can be deduced from the intermediate image.

2. The display panel of claim 1, wherein the light valve array is a liquid crystal light valve array, wherein each of the plurality of light valve portions comprises:
a liquid crystal layer, comprising liquid crystal molecules; and
a control electrode, configured to control deflection of the liquid crystal molecules in the liquid crystal layer to thereby adjust a rate of light transmittance of the each of the plurality of light valve portions.

3. The display panel of claim 2, wherein the control electrode comprises a first control sub-electrode and a second control sub-electrode, insulated from each other.

4. The display panel of claim 3, wherein each of the plurality of light valve portions is an inactive liquid crystal light valve portion, wherein the display panel further comprises:
a first signal line, electrically connected, and configured to transmit a data voltage signal, to the first control sub-electrode; and
a second signal line, electrically connected, and configured to transmit a scan voltage signal, to the second control sub-electrode.

5. The display panel of claim 3, wherein each of the plurality of light valve portions is an active liquid crystal light valve portion, wherein the display panel further comprises a first signal line, a second signal line, and a first switch component, wherein:
a first terminal of the first switch component is electrically connected to the first signal line to receive a data voltage signal therefrom;
a second terminal of the switch component is electrically connected to the first control sub-electrode; and
a control terminal of the first switch component is electrically connected to a second signal line to receive a scan voltage signal therefrom.

6. The display panel of claim 5, wherein the display panel further comprises a third signal line, electrically connected, and configured to transmit a common voltage signal, to the second control sub-electrode.

7. The display panel of claim 1, wherein the light valve array is an electronic ink light valve array, wherein each of the plurality of light valve portions comprises:
an electronic ink layer having a plurality of charged light-blocking particles; and
a control electrode, configured to control distribution of the plurality of charged light-blocking particles in the electronic ink layer to thereby adjust a rate of light transmittance of the each of the plurality of light valve portions.

8. The display panel of claim 7, wherein the control electrode comprises a first control sub-electrode, a second control sub-electrode, a third control sub-electrode, and a fourth control sub-electrode, wherein:
the first control sub-electrode and the second control sub-electrode are respectively over two opposing surfaces of the electronic ink layer, wherein each of the two opposing surfaces is substantially in parallel to the electronic ink layer; and
the third control sub-electrode and the fourth control sub-electrode are respectively over two opposing side surfaces of the electronic ink layer, wherein each of the two opposing side surfaces is substantially perpendicular to the electronic ink layer.

9. The display panel of claim 1, wherein the light valve array is an electrochromic light valve array, wherein each of the plurality of light valve portions comprises:
an electrochromic layer; and
a control electrode configured to be applied with a voltage to thereby adjust a rate of light transmittance of the each of the plurality of light valve portions.

10. The display panel of claim 9, wherein the control electrode comprises a first control sub-electrode and a second control sub-electrode, wherein:
the first control sub-electrode and the second control sub-electrode are respectively over two opposing surfaces of the electrochromic layer, wherein each of the two opposing surfaces is substantially in parallel to the electrochromic layer.

11. The display panel of claim 1, wherein each of the plurality of displaying pixels comprises a plurality of sub-pixels, each configured to emit a different color and together configured to obtain a white color, wherein:
each of the plurality of sub-pixels comprises a light-emitting component, selected from an organic light-emitting diode or a micro light-emitting diode pixel.

12. The display panel of claim 1, wherein the imaging array comprises an active pixel imaging array, wherein each of the plurality of imaging pixels comprises a photosensitive component, wherein the photosensitive component comprises a photodiode or a photoresistor.

13. The display panel of claim 12, wherein each of the plurality of imaging pixels comprises:
a photodiode, configured to convert an optical signal into an electric signal; and
a first capacitor, configured to store the electric signal; wherein:
a first terminal of the photodiode is electrically connected to a first terminal of the first capacitor; and
a second terminal of the photodiode and a second terminal of the first capacitor are both electrically connected to a first power source terminal.

14. The display panel of claim 13, further comprising a signal reading circuit, a second switch component, a fourth signal line, and a fifth signal line, wherein:
a first terminal of the second switch component is electrically connected to the fourth signal line;
a second terminal of the second switch component is electrically connected to the each of the plurality of imaging pixels;
a control terminal of the second switch component is electrically connected to the fifth signal line;
the fourth signal line is electrically connected to the signal reading circuit; and
the signal reading circuit is configured to read the electrical signal of the each of the plurality of imaging pixels.

15. The display panel of claim 1, further comprising a first substrate and a second substrate, opposing to each other, wherein:
the light valve array and the imaging array are between the first substrate and the second substrate; and
the imaging array is closer to the first substrate in relation to the light valve array.

16. The display panel of claim 1, wherein each light valve portion corresponds to at least one imaging pixel.

17. The display panel of claim 16, wherein each light valve portion corresponds to two imaging pixels, wherein:

an orthographic projection of the each light valve portion on the light-entering surface completely overlaps with the orthographic projections of the at least imaging pixels on the light-entering surface.

18. A display apparatus, comprising a display panel claim 1.

19. A method for capturing an image of an object using a display panel of claim 1, comprising:
controlling the displaying array and the light valve array to respectively form a second mask pattern and a first mask pattern;
generating an intermediate image based on lights from the object and transmitting through the second mask pattern and the first mask patterns; and
deducing the image of the object from the intermediate image based on a first decoding function respectively corresponding to the first mask pattern and a second decoding function corresponding to the second mask pattern.

20. The display apparatus of claim 18, wherein the light valve array is a liquid crystal light valve array, an electronic ink light valve array, or an electrochromic light valve array.

* * * * *